United States Patent
Torii et al.

[19]

[11] Patent Number: 6,105,225
[45] Date of Patent: Aug. 22, 2000

[54] METHOD OF MANUFACTURING A THIN FILM SENSOR ELEMENT

[75] Inventors: Hideo Torii, Higashiosaka; Takeshi Kamada, Nara; Shigenori Hayashi, Gose; Ryoichi Takayama, Suita; Takashi Hirao, Moriguchi; Masumi Hattori, Hirakata, all of Japan

[73] Assignee: Matsushita Electric Industrial Co., Ltd., Osaka, Japan

[21] Appl. No.: 08/600,863

[22] Filed: Feb. 9, 1996

Related U.S. Application Data

[62] Division of application No. 08/374,989, Jan. 19, 1995, Pat. No. 5,612,536.

[30] Foreign Application Priority Data

Feb. 7, 1994 [JP] Japan ................................... 6-013413
Jun. 20, 1994 [JP] Japan ................................... 6-136981

[51] Int. Cl.⁷ ............................................... H01L 41/22
[52] U.S. Cl. ........................ 29/25.35; 29/423; 250/338.3; 310/321; 310/324
[58] Field of Search ............................. 29/25.35, 423; 250/338.3, 338.2; 73/514.34; 310/324, 321

[56] References Cited

U.S. PATENT DOCUMENTS

| | | | |
|---|---|---|---|
| 4,066,527 | 1/1978 | Takagi et al. | 204/192 |
| 4,339,764 | 7/1982 | Schoolar | 357/30 |
| 4,480,209 | 10/1984 | Okamoto et al. | 310/313 |
| 4,532,424 | 7/1985 | Cheung | 250/338 |
| 5,209,119 | 5/1993 | Polla et al. | 73/723 |
| 5,210,455 | 5/1993 | Takeuchi et al. | 310/328 |
| 5,286,975 | 2/1994 | Ogura et al. | 250/338.3 |
| 5,413,667 | 5/1995 | Fujii et al. | 216/20 |
| 5,448,068 | 9/1995 | Lee et al. | 250/338.3 |

FOREIGN PATENT DOCUMENTS

| | | |
|---|---|---|
| 0 435 397 A1 | 7/1991 | European Pat. Off. . |
| 0 596 329 A1 | 5/1994 | European Pat. Off. . |
| 0 602 532 A2 | 6/1994 | European Pat. Off. . |
| 62-162369 | 7/1987 | Japan . |
| 211520 | 9/1987 | Japan ................... 250/338.3 |
| 5-283756 | 10/1993 | Japan . |

*Primary Examiner*—Carl E. Hall
*Attorney, Agent, or Firm*—Morrison & Foerster LLP

[57] ABSTRACT

A method of manufacturing a small, light, highly accurate and inexpensive thin film sensor element is disclosed. The thin film sensor element comprises a sensor holding substrate having an opening part and a multilayer film structure adhered thereon. The multilayer film structure comprises a first electrode film, a second electrode film, and a piezoelectric dielectric oxide film present between the first and second electrode films. The method of manufacturing the thin film sensor element comprises the steps of: forming the multilayer film structure by forming the first electrode film having a (100) plane orientation on a surface of an alkali halide substrate, forming the piezoelectric dielectric oxide thereon, and forming the second electrode film on the piezoelectric dielectric oxide; adhering the multilayer film structure on the surface of the sensor holding substrate having the opening part; and dissolving and removing the alkali halide substrate with water.

22 Claims, 29 Drawing Sheets

FIG. 29 (a) (PRIOR ART)
FIG. 29 (b) (PRIOR ART)
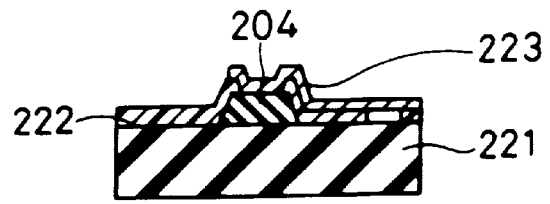
FIG. 29 (c) (PRIOR ART)
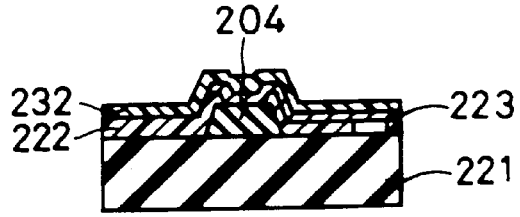
FIG. 29 (d) (PRIOR ART)
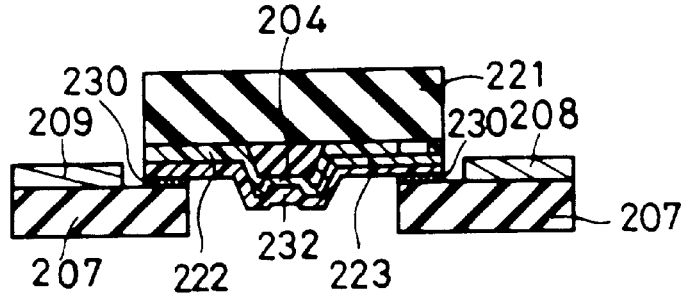
FIG. 29 (e) (PRIOR ART)
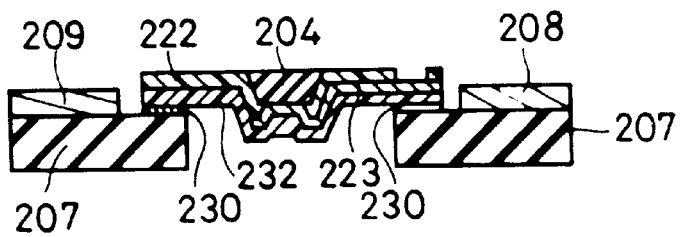
FIG. 29 (f) (PRIOR ART)
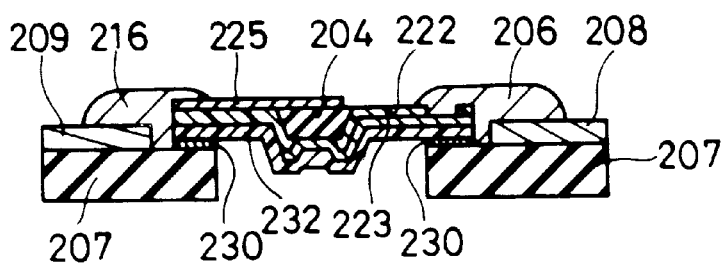

METHOD OF MANUFACTURING A THIN FILM SENSOR ELEMENT

This application is a division of Ser. No. 08/374,989 filed Jan. 19, 1995, now U.S. Pat. No. 5,612,536.

FIELD OF THE INVENTION

This invention relates to a thin film sensor element which is useful for an acceleration sensor element and for a pyroelectric infrared sensor element etc. by using a dielectric thin film, and further relates to a method of manufacturing the thin film sensor element.

BACKGROUND OF THE INVENTION

Recently, an acceleration sensor is in great demand, for example, in the fields of transportation such as the automobile, train, space and aeronautic industry, medical care, and industrial instrumentation. A mechanical sensor has been used conventionally, but this type is increasingly being replaced by a curved gage type using a semiconductor, or a capacitance type in order to achieve a compact size, high performance, low price, and high reliability. A semiconductor type acceleration sensor is manufactured by means of semiconductor techniques and micromachining techniques. A curved gage type acceleration sensor is configured as in the example shown in FIG. 14 (H. V. Allen et al., Sensors and Actuators, 20 (1989), pp. 153–161). In FIG. 14, reference numeral 71 represents a curved gage type acceleration sensor element; 22 represents, a cantilever part; 23 represents a gage resistance part (piezoresistance element); 24 represents a connection electrode; 25 represents an upper stopper wafer; 26 represents a sensing wafer; 27 represents a lower stopper wafer; 28 represents an air gap; and 29 represents a dead weight part. When an acceleration is imposed on the dead weight part, the cantilever part is curved or distorted, and according to piezoresistance effects, the amount of electric resistance of the diffusion layer (gage resistance part: piezoresistance element) formed on top of the cantilever part changes. By means of a Wheatstone bridge circuit comprising four pieces of piezoresistance elements, an acceleration signal can be detected in the form of voltage output.

Furthermore, a capacitance type acceleration sensor is configured as in the example shown in FIG. 15 (H. Seidel et al., Sensors and Actuators, A21–A23, (1990", pp. 312–315). In FIG. 15, reference numeral 81 represents a capacitance type acceleration sensor element; 32 represents an upper counter electrode; 33 a dead weight electrode (movable electrode); 34 represents a lower counter electrode; 35 represents an upper glass; 36 represents a silicon resin; 37 represents a lower glass; 38 represents an air gap; and 39 represents a dead weight part. As for the electrodes for forming capacitance, one of the electrodes serving as the dead weight electrode 33 is disposed on top of the dead weight part 31. By detecting the amount of capacitance change accompanied by a change in distance between the fixed upper counter electrode part 32 and the lower counter electrode 34, an acceleration signal can be obtained. The capacitance type shows a great capacity change by the imposed acceleration, so that a highly accurate measurement is possible by devising a detecting circuit.

The acceleration sensor using a semiconductor is characterized in that peripheral circuits such as an amp etc. can be integrated as well. Therefore, it is possible to attain a small size and high performance by reducing the number of components and connecting points.

On the other hand, a pyroelectric infrared sensor is a thermal type infrared sensor which applies a dielectric thin film. This sensor can be operated at room temperature and has a small wavelength dependency of sensitivity. This sensor is highly sensitive among thermal type sensors. This pyroelectric infrared sensor makes use of titanate lead lanthanum (hereinafter abbreviated as PLT) as a dielectric material possessing large pyroelectric characteristics, and is usually manufactured by using a PLT film crystal-oriented to a "c-axis" which is a crystal orientation having the highest pyroelectric coefficient. In order to convert efficiently an intercepted infrared ray to a sensor output, it is necessary for the pyroelectric infrared sensor to have a PLT film which is sensitive to a thermal change corresponding to a change in the intercepted infrared amount. Therefore, a holding structure supporting the PLT film is designed, with respect to form and material, to be small in heat capacity and also such that thermal loss due to heat conduction is small.

For example, when a pyroelectric infrared sensor is used for an infrared point sensor, a conventional pyroelectric infrared sensor element comprising the central part is configured as shown in FIG. 28. Namely, a PLT film 204 having a thickness of about 3 μm is disposed on the both surfaces with a lower lead electrode 223 and a upper lead electrode 225. In order to reduce heat capacity and heat conduction, only polyimide resin films 222 and 232 hold the combination of the PLT film 204, the lower lead electrode 223, and the upper lead electrode 225. Furthermore, the polyimide resin films 222 and 232 are held at the circumference by a ceramic substrate 207 made of ceramics which is disposed with a through-hole in the central part having a rectangular cross-section. Here, reference numerals 206, 216, and 230 represent conductive adhesives; and 208 and 209 represent connection electrodes.

The pyroelectric infrared sensor element as configured above was manufactured by a conventional method shown in FIG. 29 (a) to (f) (e.g., cf. Ryoichi Takayama, et al., "Pyroelectric infrared picture image sensor", National Technical Report, Vol. 39 (No. 4) (1993), pp. 122–133).

First, a MgO monocrystal substrate 221 having a cleavage plane of (100) and having been mirror polished is prepared. While the MgO monocrystal substrate 221 is kept at a heating temperature of 600° C., a ceramic target made of titanate lead lanthanum is sputtered by an rf sputtering method to form the PLT film 204 which is oriented to the c-axis on the surface of the MgO monocrystal substrate 221 (FIG. 29 (a)). Next, polyimide resin is applied except for the upper surface of this PLT film 204, and the first layer of polyimide resin film 222 is formed. Then, on top of this layer, the lower lead electrode film 223 of Ni—Cr is formed by a sputtering method (FIG. 29 (b)). Furthermore, polyimide resin is applied on the surface to form the second layer of polyimide resin film 232 (FIG. 29 (c)). The MgO monocrystal substrate 221 disposed thereon with the above-mentioned multilayer film composition is reversed and placed on top of the ceramic substrate 207 made of ceramics such as alumina, which is disposed with a through-hole in the central part having a rectangular cross-section. Then, the MgO monocrystal substrate 221 and the ceramic substrate 207 are adhered and fixed by the adhesive 230 (FIG. 29 (d)). After adhering, for the purpose of improving thermal sensitivity of the PLT film 204, MgO in the MgO monocrystal substrate 221 is etched and removed completely except for the multilayer film composition formed on the MgO monocrystal substrate 221 (FIG. 29 (d)). By removing MgO, the PLT film 204 is newly exposed to the surface, and the Ni—Cr upper lead electrode film 225 is formed thereon. In addition, the connection electrodes 209 and 208 which were formed in advance on top of the ceramic substrate 227 are connected with the upper lead electrode 225 and the lower lead electrode 223 by means of the conductive paste 206 and 216 (FIG. 29 (*f*)). In this way, the conventional pyroelectric infrared sensor element can be obtained.

Although the semiconductor type acceleration sensor mentioned above can be miniaturized by integration using semiconductor techniques, this acceleration sensor has the problem of having complicated manufacturing steps, since it is necessary to form a dead weight part or a cantilever part by applying micromachining techniques such as anisotropic etching using an alkaline solution. For example, the curved gage type uses an anisotropic etching technique for forming a cantilever part, but it is difficult to control the thickness etc. of the cantilever part. Also, in order to attain shock resistance and resonance resistance, when the cantilever part for the support of a dead weight part comprises a plurality of components, each part was required to be accurate in size etc., so that the manufacturing steps became even more complicated.

As for the conventional pyroelectric infrared sensor element mentioned above with reference to FIG. 29, the PLT film 204 comprising a pyroelectric dielectric oxide film is held only by the polyimide resin films 222 and 223, and the above-noted polyimide resin films 222 and 223 are held at the circumference by the ceramic substrate 207. Therefore, because of the contraction etc. caused by the difference in material characteristics between the polyimide resins 222, 223, the PLT film 204, and the ceramic substrate 227, the lead electrodes 223 and/or 125 were vulnerable to disconnections. A further problem was that the polyimide films 222 and/or 223 which hold the PLT film 204 tended to crack easily.

Furthermore, since the manufacturing method of the conventional pyroelectric infrared sensor element uses an expensive MgO monocrystal substrate which has a cleavage plane of (100) and has a mirror that must be polished, the infrared sensor element also becomes expensive. Moreover, after the pyroelectric dielectric oxide film was formed, the MgO monocrystal substrate 221 which was placed directly below the PLT film 204 needed to be removed carefully by an etching method. Thus, this manufacturing method has the problem of being complicated.

SUMMARY OF THE INVENTION

It is an objective of this invention to solve the above-noted problems in the conventional systems by providing a thin film sensor element which is small, light, highly accurate, and inexpensive. A further objective of this invention is to provide a method of manufacturing the thin film sensor element. In particular, an object of this invention is to provide an acceleration sensor element which is small, light, accurate, and inexpensive, and a method of manufacturing the same. A further object of this invention is to provide a pyroelectric infrared sensor element which does not use a MgO monocrystal as a foundation substrate and which does not require removal of a foundation substrate used to form the pyroelectric thin film part, and also to provide a method of manufacturing the same.

In order to accomplish these and other objects and advantages, a thin film sensor element of this invention comprises a sensor holding substrate having an opening part and a multilayer film adhered thereon comprising an electrode film A, an electrode film B having (100) plane orientation, and a piezoelectic dielectric oxide film present between the electrode film A and the electrode film B.

It is preferable that the multilayer film structure, formed by disposing a piezoelectric dielectric oxide film on the surface of an electrode film B having (100) plane orientation and by disposing an electrode film A on top of the piezoelectric dielectric oxide film, is reversed and adhered to a sensor holding substrate having an opening part.

It is also preferable that the electrode film B having (100) plane orientation is selected from the group consisting of a Pt electrode film and a conductive NiO electrode film.

Furthermore, it is preferable that the electrode film B having (100) plane orientation is a Pt electrode film oriented to (100) plane on the surface of a rock-salt crystal structure oxide film oriented to (100) plane. The rock-salt crystal structure refers to a structure, in which two different atoms A and X exist alternatively in simple cubic sphere packing, each atom being surrounded by six others at the vertices of a regular octahedron.

In addition, it is preferable that the electrode film B having (100) plane orientation is a conductive NiO electrode film oriented to (100) plane on the surface of a metal electrode film.

It is preferable that the thin film sensor element is formed by disposing a rock-salt crystal structure oxide film oriented to (100) plane on the surface of a sensor holding substrate having an opening part such that the opening part is covered, disposing a Pt electrode film B oriented to (100) plane thereon, disposing a piezoelectric dielectric oxide film thereon, and disposing an electrode film A on top of the piezoelectric dielectric oxide film.

It is also preferable that the thin film sensor element is formed by disposing a metal electrode film on the surface of a sensor holding substrate having an opening part such that the opening part is covered, disposing a conductive NiO film B oriented to (100) plane thereon, disposing a piezoelectric dielectric oxide film thereon, and disposing an electrode film A on top of the piezoelectric dielectric oxide film.

Furthermore, it is preferable that the thin film sensor element is formed by disposing a conductive NiO film B on the surface of a sensor holding substrate having an opening part such that the opening part is covered, disposing a piezoelectric dielectric oxide film thereon, and disposing an electrode film A on top of the piezoelectric dielectric oxide film.

In addition, it is preferable that the sensor holding element is made of ceramics.

It is preferable that the rock-salt crystal structure oxide film is at least one film selected from the group consisting of MgO, NiO, and CoO.

It is also preferable that the piezoelectric dielectric oxide film comprises a titanate lead zirconate (PZT) film.

It is preferable that the piezoelectric dielectric oxide film comprises a titanate lead lanthanum (PLT) film.

Furthermore, it is preferable that lithium is added as a dopant to the NiO film.

In addition, it is preferable that the sensor element is at least one thin film sensor element selected from the group consisting of an acceleration sensor element and a pyroelectric infrared sensor element.

It is preferable that the piezoelectric dielectric oxide film has a thickness of from 100 nm to 20 $\mu$m.

A second embodiment of this invention is a method of manufacturing a thin film sensor element. The first method of manufacturing a thin film sensor element comprises a sensor holding substrate having an opening part and a multilayer film adhered thereon comprising an electrode film A, an electrode film B having (100) plane orientation, and a piezoelectic dielectric oxide film present between the electrode film A and the electrode film B, and comprises the steps of: forming at least an electrode film having (100) plane orientation on the surface of an alkali halide substrate, forming a piezoelectric dielectric oxide film thereon, and forming an electrode film thereon to form a multilayer film, adhering the multilayer film on the surface of a sensor holding substrate having an opening part, dissolving and removing the alkali halide substrate with water.

It is preferable that the alkali halide material is a rock-salt crystal comprising at least one alkali metal element selected from the group consisting of Na, K, and Cs, and at least one halogen element selected from the group consisting of F, Cl, Br, and I.

Furthermore, it is preferable that the alkali halide material is at least one salt selected from the group consisting of NaF, NaCl, KCl, KBr, CsBr, KI, and CsI.

It is also preferable that the piezoelectric dielectric oxide film has a thickness of from 100 nm and 20 μm.

In addition, it is preferable that the sensor element is at least one thin film sensor element selected from the group consisting of an acceleration sensor element and a pyroelectric infrared sensor element.

The second method of manufacturing a thin film sensor element comprises the steps of forming a multilayer film by disposing a rock-salt crystal structure oxide film oriented to (100) plane orientation on the surface of an alkali halide substrate, disposing a Pt electrode film having (100) plane orientation thereon, disposing a piezoelectric dielectric oxide film thereon, and disposing an electrode film on top of the piezoelectric dielectric oxide film, reversing and adhering the multilayer film to a ceramic substrate having an opening part, and dissolving and removing the alkali halide substrate by washing in water.

The third method of manufacturing a thin film sensor element comprises the steps of forming a multilayer film by disposing a metal electrode film on the surface of an alkali halide substrate, disposing a conductive NiO electrode film having (100) plane orientation thereon, disposing a piezoelectric dielectric oxide film thereon, and disposing an electrode film on top of the piezoelectric dielectric oxide film, reversing and adhering the multilayer film structure to a ceramic substrate having an opening part, and dissolving and removing the alkali halide substrate by washing in water.

The fourth method of manufacturing a thin film sensor element comprises the steps of forming a multilayer film structure by disposing a conductive NiO electrode film oriented to (100) plane orientation on the surface of an alkali halide substrate, disposing a piezoelectric dielectric oxide film thereon, and disposing an electrode film thereon, reversing and adhering the multilayer film to a ceramic substrate having an opening part, and dissolving and removing the alkali halide substrate by washing in water.

The fifth method of manufacturing a thin film sensor element comprises the steps of forming a substrate by filling alkali halide into an opening part of a ceramic substrate and smoothing the surface, disposing a rock-salt crystal structure oxide film having (100) plane orientation on the surface of the substrate, disposing a Pt electrode film having (100) plane orientation thereon, disposing a piezoelectric dielectric oxide film thereon, and disposing an electrode film on top of the piezoelectric dielectric oxide film, and dissolving and removing the alkali halide substrate by washing in water.

The sixth method of manufacturing a thin film sensor element comprises the steps of forming a substrate by filling alkali halide into an opening part of a ceramic substrate and smoothing the surface, disposing a metal electrode film on the surface of the substrate, disposing a conductive NiO film having (100) plane orientation thereon, disposing a piezoelectric dielectric oxide film thereon, and disposing an electrode film on the surface of the piezoelectric dielectric oxide film, and dissolving and removing the alkali halide substrate by washing in water.

The seventh method of manufacturing a thin film sensor element comprises the steps of forming a substrate by filling alkali halide into an opening part of a ceramic substrate and smoothing the surface, disposing a conductive NiO film on the surface of the substrate, disposing a piezoelectric dielectric oxide film thereon, and disposing an electrode film on the surface of the piezoelectric dielectric oxide film, and dissolving and removing the alkali halide substrate by washing in water.

In the above-noted first to the seventh manufacturing methods of this invention, it is preferable that the piezoelectric dielectric oxide film comprises a titanate lead zirconate film.

In the above-noted first to the seventh manufacturing methods of this invention, it is preferable that the piezoelectric dielectric oxide film comprises a titanate lead lanthanum film. Furthermore, it is preferable that the rock-salt type crystal oxide film is at least one film selected from the group consisting of NgO, NiO, and CoO. It is also preferable that lithium is added as a dopant to the NiO film.

According to the above-mentioned thin film sensor element of this invention, a thin film sensor element of this invention comprises a sensor holding substrate having an opening part and a multilayer film adhered thereon at least consisting of an electrode film A, an electrode film B having (100) plane orientation, and a piezoelectric dielectric oxide film present between the electrode film A and the electrode film B. As a result, a thin film sensor element which small, light, highly accurate, and inexpensive can be attained. In other words, since this invention does not require etching or reinforcement by polyimide resin, it is possible to obtain an extremely small, light, highly accurate, and inexpensive thin film sensor element.

According to the above-mentioned embodiments of this invention, an acceleration sensor element comprises a sensor holding substrate having an opening part and a multilayer film structure adhered thereon comprising an electrode film A, an electrode film B having (100) plane orientation, and a piezoelectic dielectric oxide film present between the electrode film A and the electrode film B. As a result, a lightweight self-holding type acceleration sensor can be attained which is small, light, highly accurate, and inexpensive. In other words, by using the electrode film B having (100) plane orientation, a thin film having only a thickness of about 2 to 10 μm, for example, can be formed. In addition, this film possesses high sensitivity for detecting acceleration and also sufficient strength for practical use, so that the film is characterized by the small size, lightweight, and high accuracy. Moreover, this acceleration sensor element can be manufactured with reduced cost, since it does not require using advanced techniques of micromachining which are necessary to obtain accurate size in a semiconductor type acceleration sensor.

It is preferable that the multilayer film structure formed by disposing a piezoelectric dielectric oxide film on the surface of an electrode film B having (100) plane orientation and by disposing an electrode film A on top of the piezoelectric dielectric oxide film is reversed and adhered to a sensor holding substrate having an opening part. Accordingly, a lightweight self-holding type acceleration sensor element which is even smaller, lighter, more highly accurate, and less expensive can be attained.

It is also preferable that the electrode film B having (100) plane orientation is selected from the group consisting of a Pt electrode film and a conductive NiO electrode film. Thus, a lightweight, self-holding type acceleration sensor element which is even smaller, lighter, more highly accurate, and less expensive can be attained.

Furthermore, it is preferable that the electrode film B having (100) plane orientation is a Pt electrode film oriented to (100) plane on the surface of a rock-salt type crystal structure oxide film oriented to (100) plane. As a result, the Pt electrode film oriented to (100) plane can be easily formed through the transfer of the crystal structure in the rock-salt type crystal structure oxide film.

In addition, it is preferable that the electrode film B having (100) plane orientation is a conductive NiO electrode film oriented to (100) plane on the surface of a metal electrode film. As a result, the NiO electrode film oriented to (100) plane can be easily formed through the transfer of the crystal structure in the rock-salt type crystal structure oxide film.

It is preferable that the thin film sensor element is formed by disposing a rock-salt crystal structure oxide film oriented to (100) plane on the surface of a sensor holding substrate having an opening part such that the opening part is covered, disposing a Pt electrode film B oriented to (100) plane thereon, disposing a piezoelectric dielectric oxide film thereon, and disposing an electrode film A on top of the piezoelectric dielectric oxide film. Accordingly, a lightweight, self-holding type acceleration sensor element which is even smaller, lighter, more highly accurate, and less expensive can be attained.

It is also preferable that the thin film sensor element is formed by disposing a metal electrode film on the surface of a sensor holding substrate having an opening part such that the opening part is covered, disposing a conductive NiO film B oriented to (100) plane thereon, disposing a piezoelectric dielectric oxide film thereon, and disposing an electrode film A on top of the piezoelectric dielectric oxide film. Thus, a lightweight, self-holding type acceleration sensor element which is even smaller, lighter, more highly accurate, and less expensive can be attained.

Furthermore, it is preferable that the thin film sensor element is formed by disposing a conductive NiO film B on the surface of a sensor holding substrate having an opening part such that the opening part is covered, disposing a piezoelectric dielectric oxide film thereon, and disposing an electrode film A on top of the piezoelectric dielectric oxide film. As a result, a lightweight, self-holding type acceleration sensor element which is even smaller, lighter, more highly accurate, and less expensive can be attained.

In addition, according to the preferable embodiment that the sensor holding element is made of ceramics, the sensor holding element is excellent in strength and can also be miniaturized.

It is preferable that the rock-salt crystal structure oxide film is at least one film selected from the group consisting of MgO, NiO, and CoO. Thus, (100) plane orientation can be transferred easily to the electrode B.

It is also preferable that the piezoelectric dielectric oxide film comprises a titanate lead zirconate (PZT) film. Accordingly, the piezoelectric dielectric oxide film has excellent piezoelectric properties, so that acceleration sensitivity can be enhanced.

Furthermore, it is preferable that lithium is added as a dopant to the NiO film for the purpose of enhancing the function a an electrode. In particular, it is preferable that lithium is included in the NiO film in an amount of from 2 to 10 atom percent. When the amount is less than 2 atom percent, resistivity tends to increase. When the amount is more than 10 atom percent, a lattice constant tends to become smaller, although there are low resistivity and good conductivity.

According to the first to the seventh manufacturing methods of this invention, the acceleration sensor element can be manufactured efficiently. For example, the manufacturing method comprises the steps of forming a sensor film on the surface of a water soluble substrate via a holding film and then removing the substrate part by washing in water. As a result, a lightweight, self-holding type accleration sensor element can be manufactured which has reduced size and cost.

As mentioned above, it is preferable that the substrate material soluble to solution is an alkali halide, and that the solution for dissolving this is water. Accordingly, the manufacturing process is even more simplified.

Furthermore, the pyroelectric infrared sensor element of this invention does not require a polyimide resin film for holding a piezoelectric dielectric oxide film in any of the embodiments. Instead, an oxide film or a metal film etc. is used here which is thinner and harder than the polyimide resin film and hardly differs from the piezoelectric dielectric oxide film in the contraction rate. Accordingly, electrode discontinuity or a crack in the holding film tend not to occur. In addition, since it is no longer necessary to use an expensive MgO monocrystal substrate which has a cleavage plane of (100) and must be mirror polished as the substrate, the sensor element of this invention costs less.

In order to accomplish the manufacturing of the pyroelectric infrared sensor element of this invention, the inventor has discovered a technique to manufacture monocrystal MgO, NiO, and CoO films of rock-salt crystal structure oxide films having (100) plane orientation. These films are formed by using raw material gas of magnesium acetylacetonate, nickel acetylaceconate, and cobalt acetylacetonate by means of a plasma MOCVD method (e.g., Eiji Fujii et al., Japanese Journal of Applied Physics, vol.32, 1993, pp. L414—pp. L416). Furthermore, the above-mentioned NiO film becomes a material serving as an electrode when a small amount of Li is added to the composition (Journal of Physics and Chemistry of Solids, vol. 17, 1960, pp. 7—pp. 17).

In other words, the method of manufacturing the pyroelectric infrared sensor element of this invention comprises the steps of providing an alkali halide substrate such as KBr or KCl which show great solubility against water, forming a multilayer film composition thereon, adhering the multilayer film composition to a ceramic substrate having an opening part in the vicinity of the center, and removing the above-noted alkali halide substrate by washing with water. Alternatively, the pyroelectric infrared sensor element is manufactured by filling the opening part in the ceramic substrate, smoothing the surface of the substrate, forming the multilayer film composition thereon, and removing the above-noted alkali halide by washing with water. The alkali halide can be removed easily by washing with water, so that it is no longer necessary to conduct the step of carefully removing a MgO monocrystal substrate by etching which forms the part directly below a pyroelectric dielectric oxide film after forming the pyroelectric dielectric oxide film in the conventional manufacturing method. Thus, the manufacturing method of the pyroelectric infrared sensor element can be simplified.

BRIEF DESCRIPTION OF THE DRAWINGS

FIG. 29 (a) to (f) are schematic views showing steps of a conventional manufacturing method of a pyroelectric infrared element.

DETAILED DESCRIPTION OF THE INVENTION

This invention will be described by referring to the following illustrative examples and attached figures. The examples are not intended to limit the invention in any way.

First, the acceleration sensor element of this invention will be explained.

EXAMPLE 1

Figure 1:
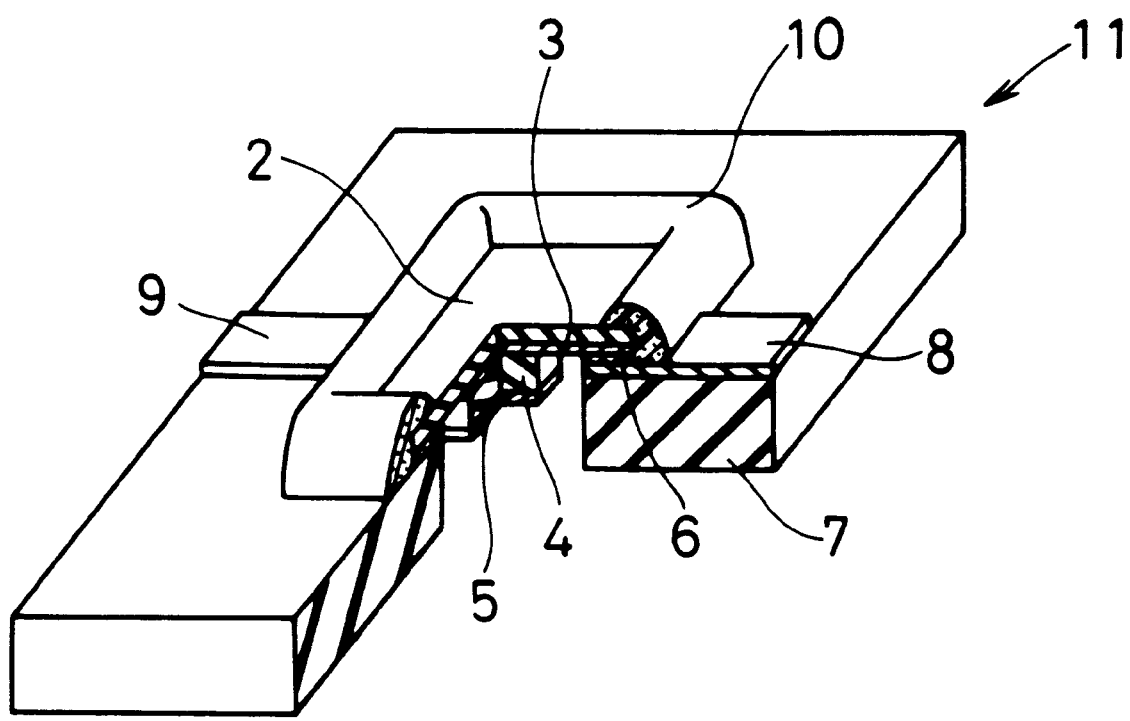
FIG. 1 is a partially cutaway view in perspective showing a first embodiment of an acceleration sensor element of this invention.

As shown in FIG. 1, an acceleration sensor element 11 of this embodiment is comprised of a PZT film 4 (size 0.2 $mm^2$, thickness 3 $\mu m$) disposed on both sides with drawer electrode films 3 and 5 used for acceleration detection. The PZT film 4 forms a multilayer film structure together with a MgO film 2 by being disposed on top of the MgO film 2 having a size of 2 $mm^2$ and a thickness of 2 $\mu m$. This sensor is configured in such a way that the multilayer film is adhered to an opening part of a sensor holding substrate 7 made of alumina. Here, the sensor holding substrate 7 has a size of 5 $mm^2$, a thickness of 1 mm, and the opening part has a size of 1 $mm^2$.

Figure 2:
FIG. 2 (a) to (f) are schematic views showing steps of a manufacturing method of an acceleration sensor element in a first embodiment of this invention.
Figure 2:
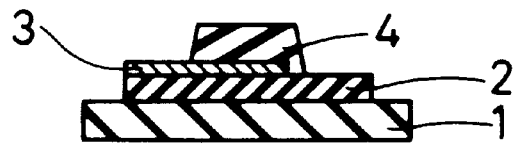
Figure 2:
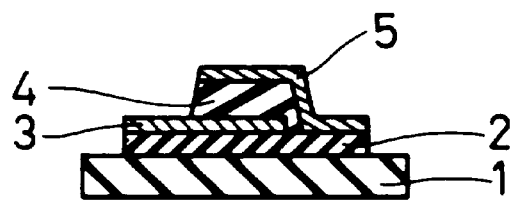
Figure 2:
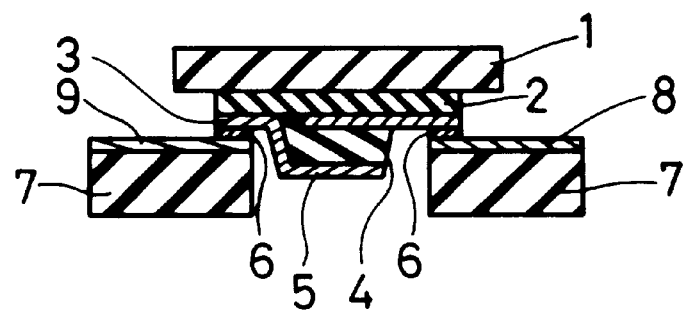
Figure 2:
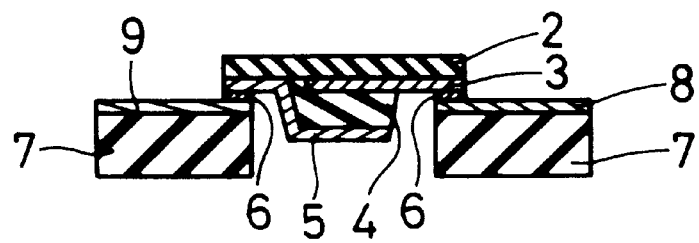
Figure 2:
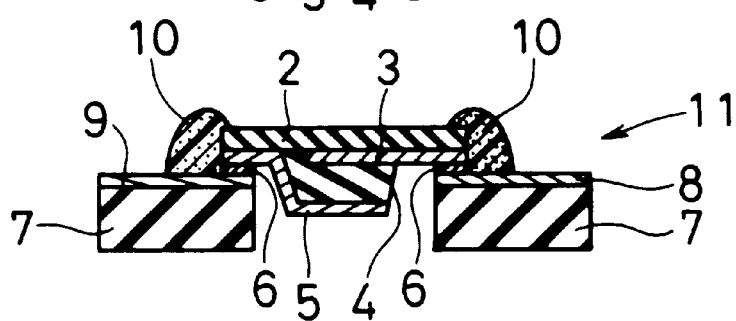

A method of manufacturing the above-configured acceleration sensor element 11 will be explained by referring to FIG. 2 (a) to (f) which shows the manufacturing steps.

First, KBr powder was press-molded with 800 $kgf/cm^2$ under reduced pressure. By smoothing the surface by polishing, a flat plate KBr substrate 1 having a size of 3 $mm^2$ and a thickness of 0.5 mm was produced. On the surface of this substrate, a rock-salt crystal structure oxide of the MgO film 2 (size 2 mm×2 mm, thickness 2 $\mu m$) was formed by a plasma enhanced metalorganic vapor deposition (MOCVD) method whose vertical direction was crystal-oriented to (100) direction against the substrate surface. This film was formed by using a mixture of magnesium acetylacetonate vapor and oxygen as CVD raw material gas and by heating the KBr substrate 1 at 400° C. Next, a sputtering method was used to form a Pt film on the surface of the MgO film 2 by an epitaxial growth, thereby forming a lead electrode film 3 of Pt film for acceleration detection which was crystal-oriented to (100) direction against the film surface. Then, by means of a rf magnetron sputtering method, the PZT film 4 which has a thickness of 3 μm and is crystal-oriented to a c-axis was formed on the surface of the lead electrode 3. Furthermore, a drawer electrode film 5 of Ni—Cr film for acceleration detection was formed on that surface by a sputtering method.

The multilayer film structure disposed on top of the KBr substrate which was obtained in the above-mentioned steps was reversed. It was placed in such a way that the multilayer film covered an opening part of the sensor holding substrate 7 made of alumina which has a size of 5 mm², a thickness of 1 mm, and the opening part penetrating the central part has a size of 1 mm Also, the lead electrode films 3 and 5 of the above-mentioned multilayer film structure were respectively in contact with connection electrodes 8 and 9 which had been formed in advance on the surface of the sensor holding substrate 7 by burning Pd paste. In this condition, a conductive adhesive 6 was applied. Then, the above-manufactured structure was washed with water, thereby removing the KBr substrate 1. After being dried, the circumference part of the MgO film 2 and the surface of the sensor holding substrate 7 were bonded for reinforcement by an epoxy resin type adhesive 10. In this way, the acceleration sensor element 11 was completed.

Although the PZT film 4 which shows pyroelectric characteristics is merely supported by the MgO film 2 of only 2 μm thick, the strength was sufficient. In addition, it was confirmed that electrode discontinuities due to cracks etc. did not occur at all.

Furthermore, instead of the rock-salt crystal structure oxide of the MgO film 2 which was crystal-oriented to (100) direction, a NiO film or a CoO film which was crystal-oriented to (100) direction could be used to manufacture the exactly same sensor element. The NiO film and the CoO film was manufactured by a plasma MOCVD method with the use of a raw material gas of nickel acetylacetonate and cobalt acetylacetonate.

In addition, it was confirmed that acceleration sensor elements with the same performance could be manufactured by using a different substrate instead of the KBr substrate 1, which also belongs to the same alkali halide materials such as KCl, KI, CsBr, and CsI.

EXAMPLE 2

Figure 3:
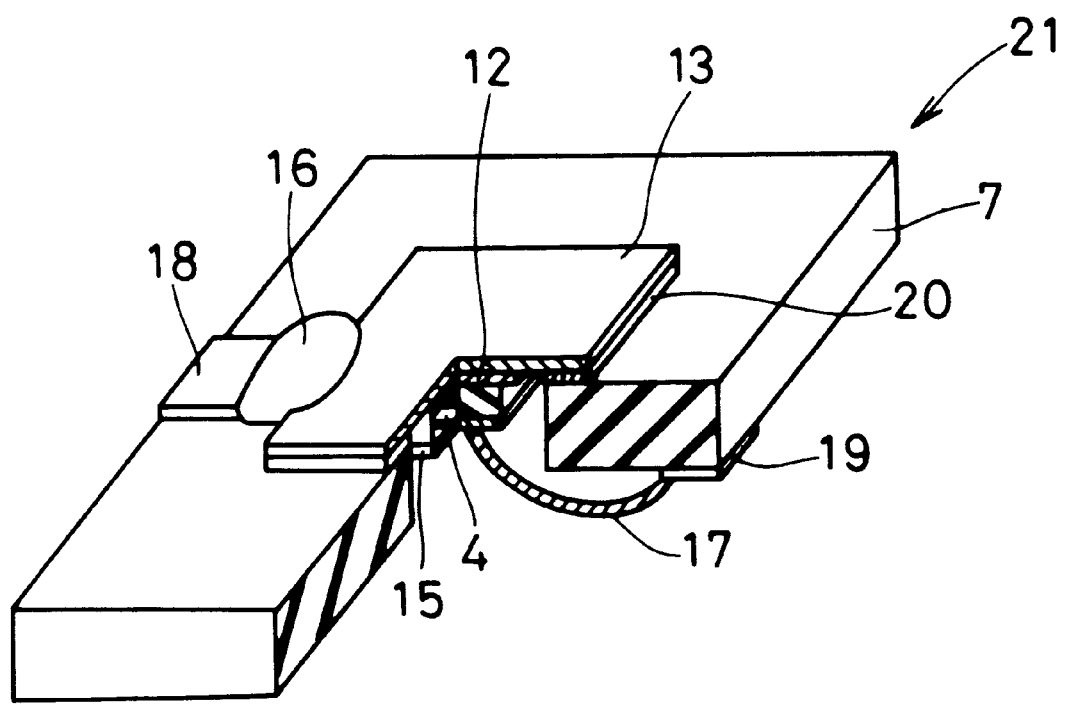
FIG. 3 is a partially cutaway view in perspective showing a second embodiment of an acceleration sensor element of this invention.

As shown in FIG. 3, an acceleration sensor element 21 of this embodiment is comprised of a metal Ni film 13 having a size of 2 mm² and a thickness of 0.8 μm which also serves as an electrode. On the surface of the metal Ni film 13, a conductive NiO film 12 is disposed with a size of 0.6 mm² and a thickness of 0.4 μm. Then, after a PZT film 4 having a size of 0.2 mm² and a thickness of 3 μm is formed on the top, a Ni—Cr electrode film 15 is disposed thereon, and this multilayer film structure is reversed. As in Example 1, this sensor is configured in such a way that the multilayer film structure is adhered to an opening part of a sensor holding substrate 7 made of alumina. Here, sensor holding substrate 7 has a size of 5 mm², a thickness of 1 mm, and the opening part penetrating the central part has a size of 1 mm².

Figure 4:
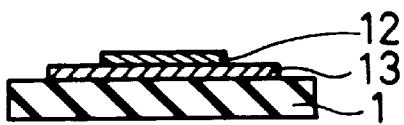
FIG. 4 (a) to (e) are schematic views showing steps of a manufacturing method of an acceleration sensor element in a second embodiment of this invention.
Figure 4:
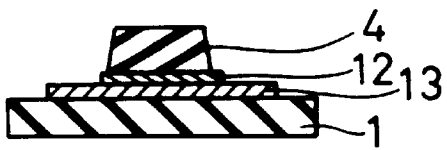
Figure 4:
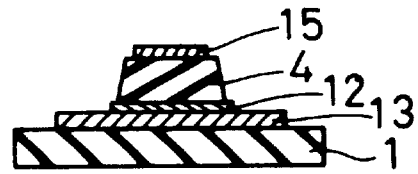
Figure 4:
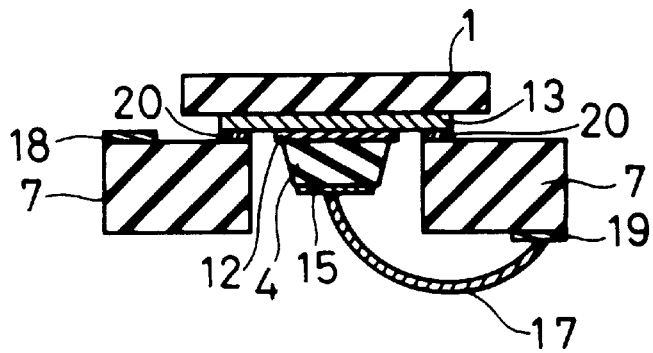
Figure 4:
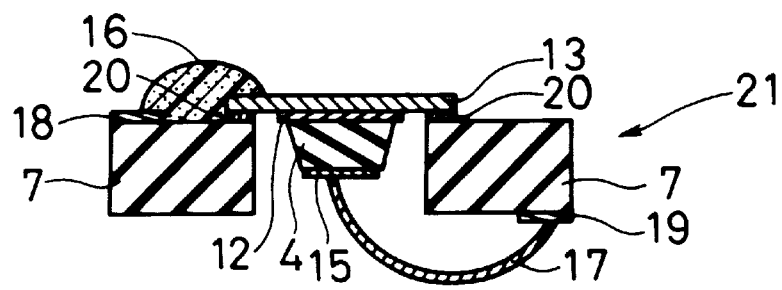

A method of manufacturing the above-configured acceleration sensor element 21 will be explained by referring to FIG. 4 (*a*) to (*e*) which shows the manufacturing steps.

First, a flat plate KBr substrate 1 having a size of 3 mm² and a thickness of 0.5 mm was produced in the same manner as in Example 1. On the surface of this substrate, a metal Ni film 13 having a size of 2 mm² and a thickness of 0.8 μm was formed by a rf sputtering method. Next, on top of that, a rock-salt crystal structure oxide of the conductive NiO film 12 (5 atom % of Li added) (size 0.6 mm×0.6 mm, thickness 0.4 μm) was formed by a plasma MOCVD method whose vertical direction was crystaloriented to (100) direction against the substrate surface. This film was formed by using mixed gas of nickel acetylacetonate vapor, Li-dipivaloylmethanechelate vapor, and oxygen as CVD raw material gas and by heating the KBr substrate at 400° C. Then, by means of a rf magnetron sputtering method, a PZT film was formed into a PZT film 4 (0.2 μm×0.2 μm) by an epitaxial growth which has a thickness of 3 μm and is crystal-oriented to a c-axis on the surface of the conductive NiO film 12. Furthermore, a Ni—Cr electrode film 15 was formed on the surface by a sputtering method.

The multilayer film structure disposed on top of the KBr substrate 1 which was obtained in the above-mentioned steps was reversed. The multilayer film structure was placed to cover an opening part of the sensor holding substrate 7 made of alumina which has a size of 5 mm², a thickness of 1 mm, and the opening part penetrating the central part with a size of 1 mm², and was adhered with an adhesive 20. By means of a wire bonding method, an Au wire 17 was used to connect the Ni—Cr electrode film 15 to a connection electrode 19 which had been formed in advance on the surface of the sensor substrate 7 by burning Pd paste. Then, the above-manufactured structure was washed with water, thereby removing the KBr substrate 1. After being dried, the metal Ni film 13 was connected by a conductive paste 16 to a connection electrode 18 which had been formed on the surface of the sensor substrate 7 in advance. In this way, acceleration sensor element 21 was completed.

Although the PZT film 4 which shows pyroelectric characteristics is merely supported by the metal Ni film 13 of only 0.8 μm thick, the strength was sufficient. In addition, it was confirmed that electrode discontinuities due to cracks etc. did not occur at all.

As in Example 1, it was confirmed that acceleration sensor elements with the same performance could be manufactured by using a different substrate instead of the KBr substrate 1, which also belongs to the same alkali halide materials such as KCl, KI, CsBr, and CsI.

EXAMPLE 3

Figure 5:
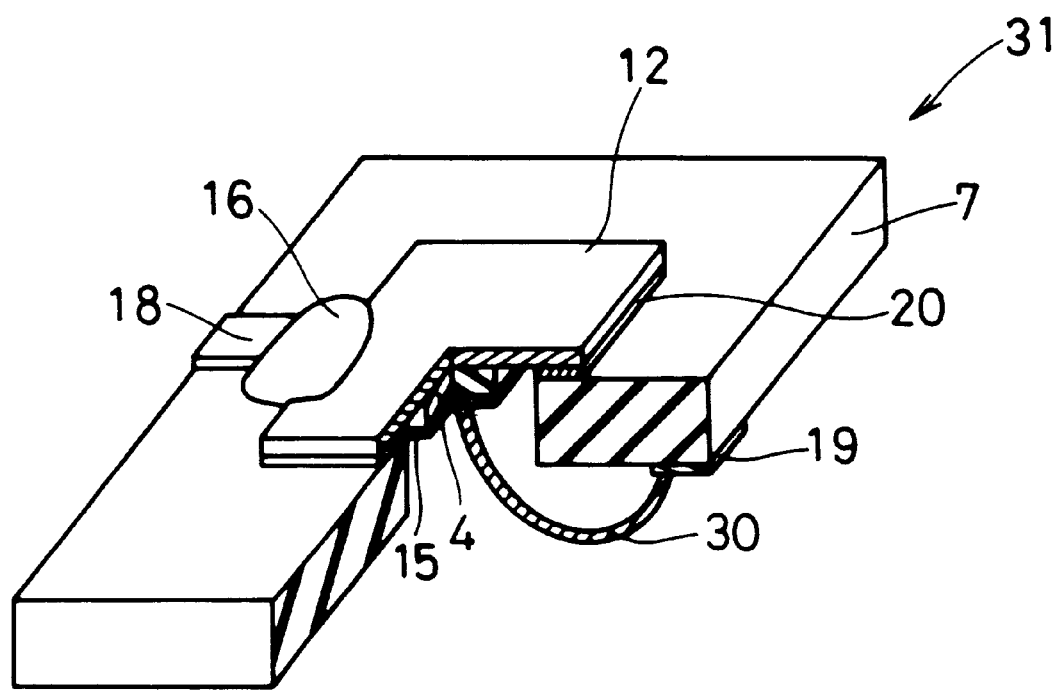
FIG. 5 is a partially cutaway view in perspective showing a third embodiment of an acceleration sensor element of this invention.

As shown in FIG. 5, an acceleration sensor element 31 of this embodiment is comprised of a conductive NiO film 12 having a size of 2 mm² and a thickness of 2 μm which also serves as an electrode. On the surface of the conductive NiO film 12, a PZT film 4 is disposed with a size of 0.2 mm² and a thickness of 3 μm. Then, a Ni—Cr electrode film 15 is formed thereon, and this multilayer film structure is reversed. As in Example 1, this sensor is configured in such a way that the multilayer film is adhered to an opening part of a sensor holding substrate 7 made of alumina. Here, the sensor holding substrate 7 has a size of 5 mm², a thickness of 1 mm, and the opening part penetrating the central part has a size of 1 mm².

Figure 6:
FIG. 6 (a) to (e) are schematic views showing steps of a manufacturing method of an acceleration sensor element in a third embodiment of this invention.
Figure 6:
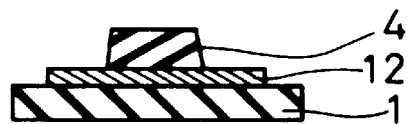
Figure 6:
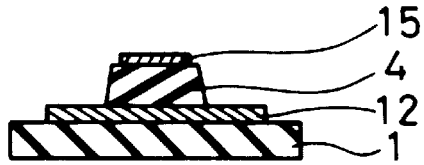
Figure 6:
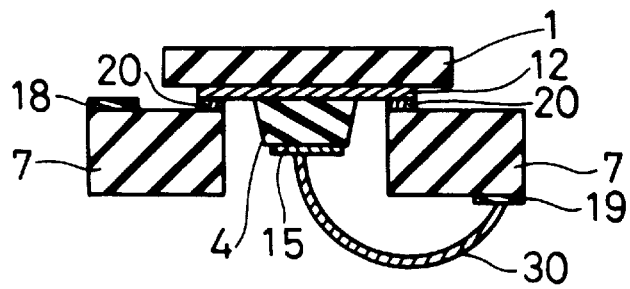
Figure 6:
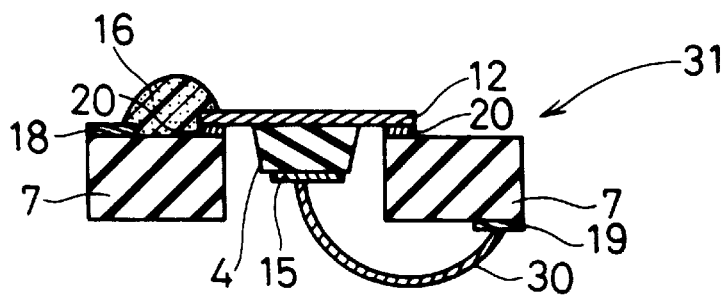

A method of manufacturing the above-configured acceleration sensor element 31 will be explained by referring to FIG. 6 (*a*) to (*e*) which shows the manufacturing steps.

First, a flat plate KBr substrate 1 having a size of 3 mm² and a thickness of 0.5 mm was produced in the same manner as in Example 1. On the surface of this substrate, in the same manner as in Example 2, a rock-salt crystal structure oxide of the conductive NiO film 12 (5 atom % of Li added) (size 2 mm×2 mm, thickness 2 μm) was formed by a plasma MOCVD method whose vertical direction was crystal-oriented to (100) direction against the substrate surface. On the surface of the conductive NiO film 12, by means of the same sputtering method of Example 1, a PZT film was formed into a PZT film 4 (0.2 μm×0.2 μm) by an epitaxial growth which has a thickness of 3 μm and is crystal-oriented to a c-axis. Furthermore, a Ni—Cr electrode film 15 was formed on the surface by a sputtering method.

The multilayer film structure disposed on top of the KBr substrate 1 which was obtained in the above-mentioned steps was reversed. The multilayer film strucutre was placed to cover an opening part of the sensor holding substrate 7 made of alumina which has a size of 5 mm², a thickness of 1 mm, and the opening part penetrating the central part with a size of 1 mm², and was adhered with an adhesive 20. By means of a wire bonding method, a Cu wire 30 was used to connect the Ni—Cr electrode film 15 to a connection electrode 19 which had been formed in advance on the surface of the sensor substrate 7. Then, the above-manufactured structure was washed with water, thereby removing the KBr substrate 1. After being dried, the conductive NiO film 31 was connected by a conductive paste 16 to a connection electrode 18 which had been formed on the surface of the sensor substrate 7 in advance. In this way, the acceleration sensor element 31 was completed.

Although the PZT film 4 which shows pyroelectric characteristics is merely supported by the NiO film 12 of only 2 μm thick, the strength of acceleration sensor element 31 was sufficient. In addition, it was confirmed that electrode discontinuities due to cracks etc. did not occur at all.

As in Example 1, it was confirmed that acceleration sensor elements with the same performance could be manufactured by using a different substrate instead of the KBr substrate 1, which also belongs to the same alkali halide materials such as KCl, KI, CsBr, and CsI.

EXAMPLE 4

Figure 7:
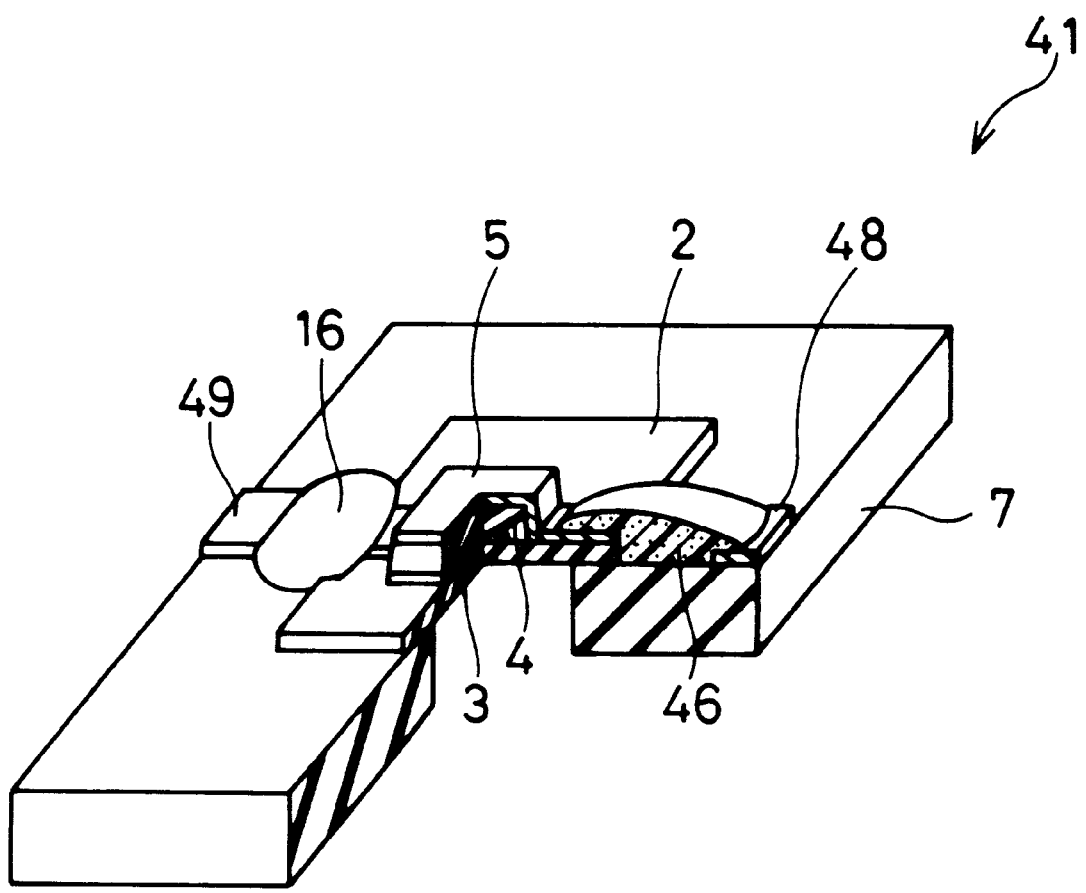
FIG. 7 is a partially cutaway view in perspective showing a fourth embodiment of an acceleration sensor element of this invention.

As shown in FIG. 7, an acceleration sensor element 41 of this embodiment is comprised of a PZT film 4 (size 0.2 mm², thickness 3 μm) disposed on both sides with lead electrode films 3 and 5 used for acceleration detection, as in Example 1. The PZT film 4 forms a multilayer film structure together with a MgO film 2 by being disposed on top of the MgO film 2 having a size of 2 mm² and a thickness of 2 μm. This sensor is configured in such a way that the multilayer film structure is formed directly on an opening part of a sensor holding substrate 7 made of alumina. Here, the sensor holding substrate 7 has a size of 5 mm², a thickness of 1 mm, and the opening part penetrating the central part has a size of 1 mm².

Figure 8:
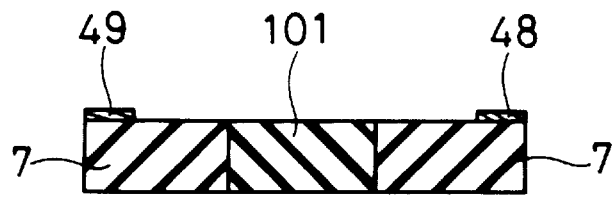
FIG. 8 (a) to (f) are schematic views showing steps of a manufacturing method of an acceleration sensor element in a fourth embodiment of this invention.
Figure 8:
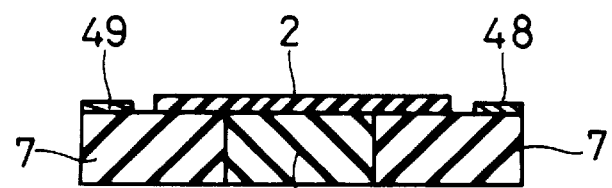
Figure 8:
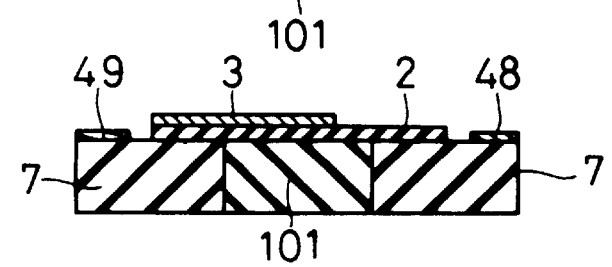
Figure 8:
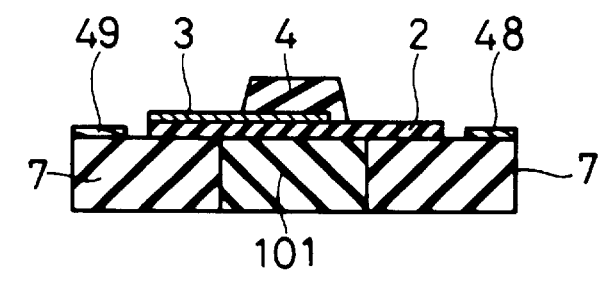
Figure 8:
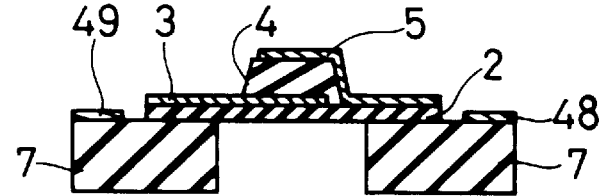
Figure 8:
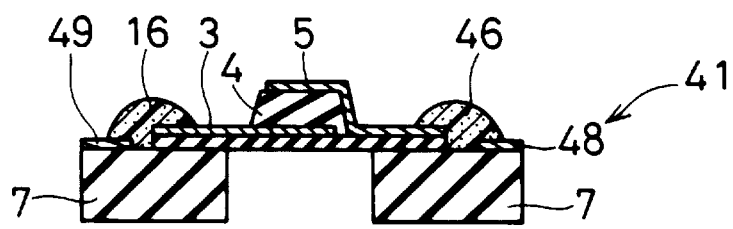

A method of manufacturing the above-configured acceleration sensor element 41 will be explained by referring to FIG. 8 (*a*) to (*f*) which shows the manufacturing steps.

As in Example 1, the sensor holding substrate 7 made of alumina which has a size of 5 mm², a thickness of 1 mm, and the opening part penetrating the central part has a size of 1 mm was applied with Pd paste and burned at 1050° C. to form connection electrodes 48 and 49. After filling KBr powder into the opening part of the above-noted sensor substrate and hardening the powder, KBr was heated in this condition at 740° C. under reduced pressure and melted. In this way, the sensor substrate having a filled opening part was formed. The part filled with KBr was smoothed by polishing the surface. As in Example 1, a rock-salt crystal structure oxide of the MgO film 2 (size 2 mm×2 mm, thickness 2 μm) was formed on the surface of substrate having the KBr filled part by a plasma MOCVD method. The vertical direction of the MgO film 2 was crystal-oriented to (100) direction against the substrate surface.

Next, by means of a sputtering method, a Pt film was formed into an lead electrode film 3 for acceleration detection by an epitaxial growth which was crystal-oriented to (100) direction against the film surface. Then, a rf magnetron sputtering method was used to form a PZT film 4 with a thickness of 3 μm which was crystal-oriented to a c-axis on the surface of the lead electrode film 3. On the surface of the PZT film 4, a lead electrode film 5 of Ni—Cr film was formed. The above-manufactured structure was washed with water, thereby removing the KBr filled part 101. After being dried, the lead electrode film 5 was connected to the connection electrode 49 by conductive paste 16, and the lead electrode film 5 of Ni—Cr film was connected to the connection electrode 48 by conductive paste 46. In this way, acceleration sensor element 41 was completed.

Although the PZT film 4 which shows pyroelectric characteristics is merely supported by the NiO film 12 of only 2 μm thick, the strength of the acceleration sensor element 41 was sufficient. In addition, it was confirmed that electrode discontinuities due to cracks etc. did not occur at all.

Instead of the MgO film 2, a NiO film or a CoO film which was crystal-oriented to (100) direction could be used to manufacture the exactly same sensor element. The NiO film and the CoO film was manufactured by a plasma MOCVD method by using a raw material gas of nickel acetylacetonate and cobalt acetylacetonate.

In addition, it was confirmed that acceleration sensor elements with the same performance could be manufactured by using a different powder instead of KBr powder, which also belongs to the same alkali halide materials such as KCl, KI, CsBr, and CsI.

EXAMPLE 5

Figure 9:
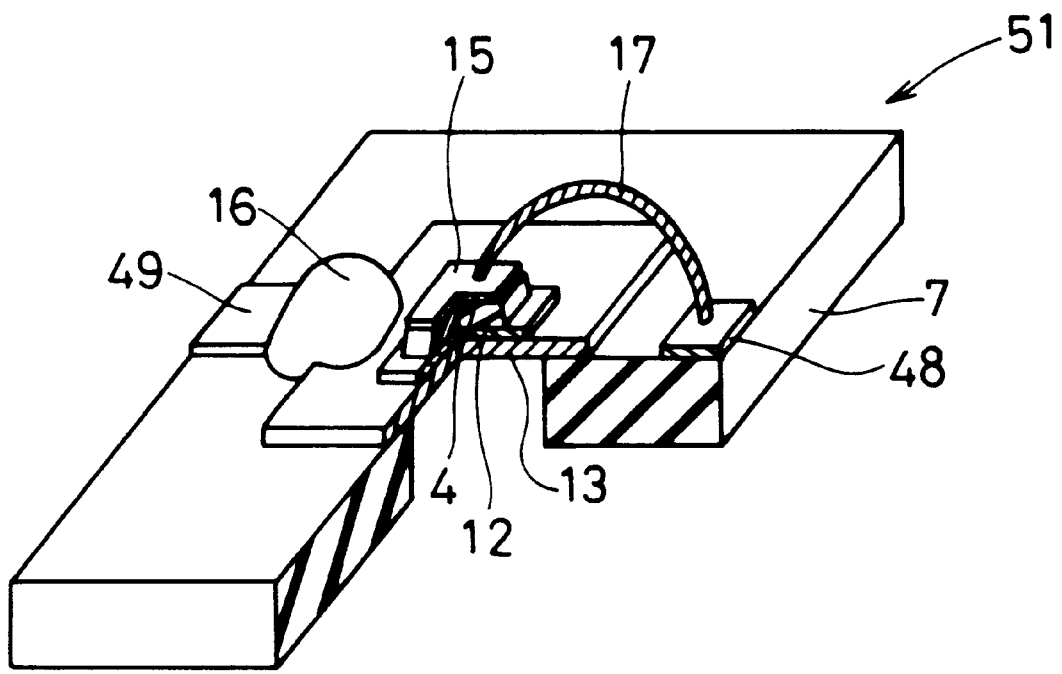
FIG. 9 is a partially cutaway view in perspective showing a fifth embodiment of an acceleration sensor element of this invention.

As shown in FIG. 9, an acceleration sensor element 51 of this embodiment is comprised of a metal Ni film 13 having a size of 2 mm² and a thickness of 0.8 μm which also serves as an electrode, as in Example 2. On the surface of metal the Ni film 13, a conductive NiO film 12 is disposed with a size of 0.6 mm² and a thickness of 0.4 μm. Then, after a PZT film 4 having a size of 0.2 mm² and a thickness of 3 μm is formed on the top, a Ni—Cr electrode film 15 is disposed thereon, thereby forming a multilayer film structure. This sensor is configured in such a way that this multilayer film structure is adhered directly on an opening part of a sensor holding substrate 7 made of alumina. The sensor holding substrate 7 has a size of 5 mm², a thickness of 1 mm, and the opening part penetrating the central part has a size of 1 mm².

Figure 10:
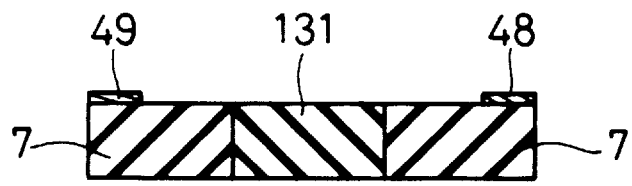
FIG. 10 (a) to (e) are schematic views showing steps of a manufacturing method of an acceleration sensor element in a fifth embodiment of this invention.
Figure 10:
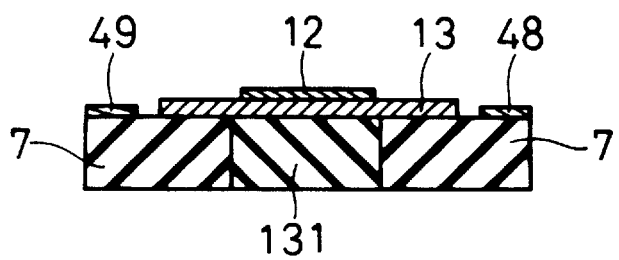
Figure 10:
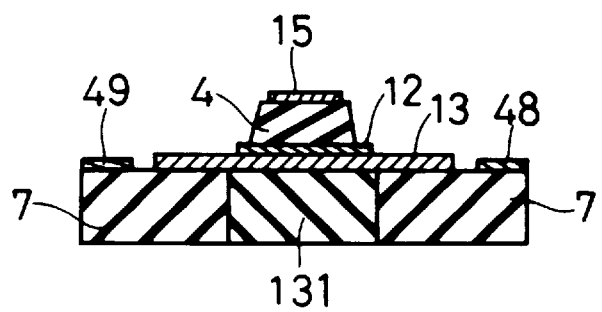
Figure 10:
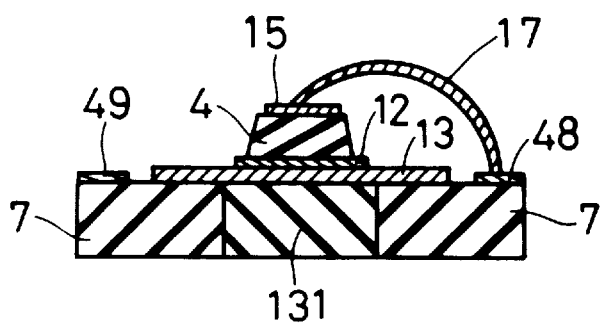
Figure 10:
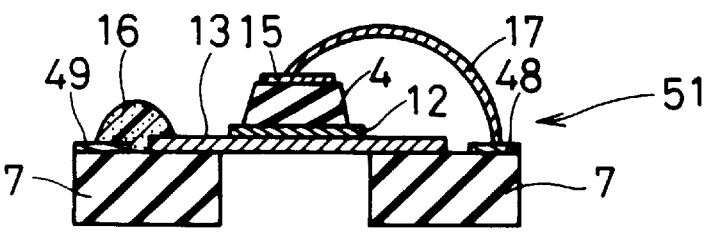

A method of manufacturing the above-configured acceleration sensor element 51 will be explained by referring to FIG. 10 (*a*) to (*e*) which shows the manufacturing steps.

First, a substrate was produced in the same manner as in Example 4. On the surface of this substrate, a metal Ni film 13 having a size of 2 mm² and a thickness of 0.8 μm was formed by a rf sputtering method. Next, on top of that, in the same manner as in Example 2, a rock-salt crystal structure oxide of the conductive NiO film 12 (5 atom % of Li added) (size 0.6 mm×0.6 mm, thickness 0.4 μm) was formed by a plasma MOCVD method whose vertical direction was crystal-oriented to (100) direction against the substrate surface. Then, by means of a rf magnetron sputtering method, a PZT film was formed by an epitaxial growth into a PZT film 4 (0.2 μm×0.2 μm) which has a thickness of 3 μm and is crystal-oriented to a c-axis on the surface of the conductive NiO film 12. Furthermore, a Ni—Cr electrode film 15 was formed on the surface by a sputtering method. By means of a wire bonding method, an Au wire 17 was used to connect Ni—Cr electrode film 15 to a connection electrode 48. Then, the above-manufactured structure was washed with water, thereby removing a KBr filled part 131. After being dried, the metal Ni film 13 was connected by a conductive paste 16 to a connection electrode 49. In this way, the acceleration sensor element 51 was completed.

In the acceleration sensor element 51, although the PZT film 4 which shows pyroelectric characteristics is merely supported by the metal Ni film 13 of only 0.8 μm thick, the strength was sufficient. In addition, it was confirmed that electrode discontinuities due to cracks etc. did not occur at all.

As in Example 4, it was also confirmed that acceleration sensor elements with the same performance could be manufactured by using a different alkali halide material instead of KBr, such as KCl, KI, CsBr, and CsI.

EXAMPLE 6

Figure 11:
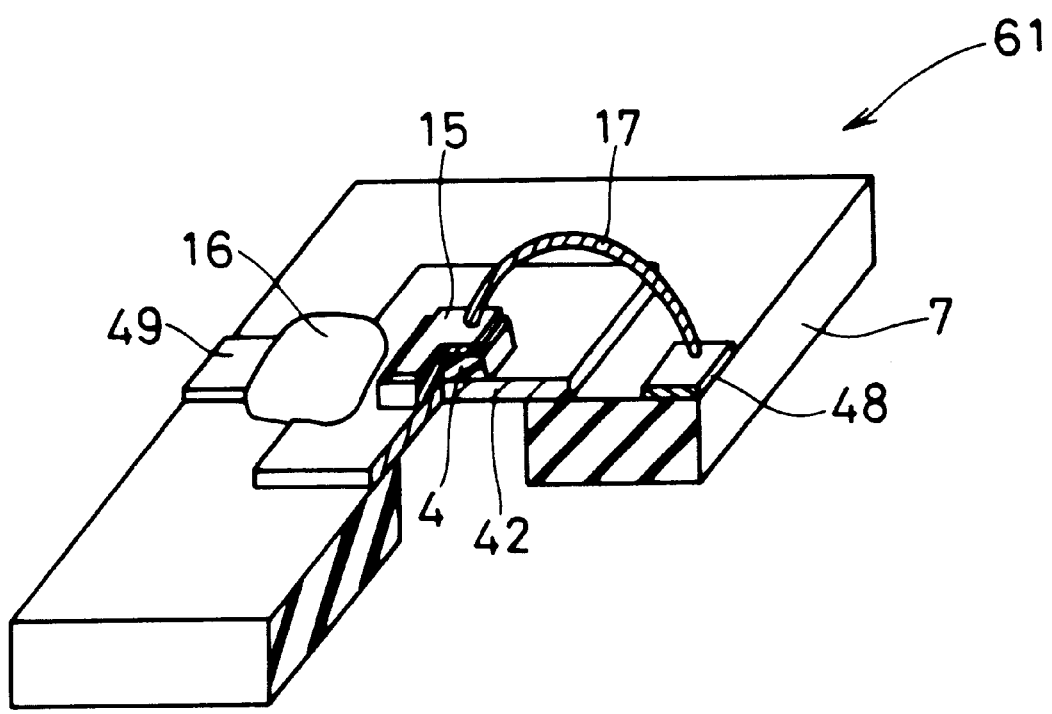
FIG. 11 is a partially cutaway view in perspective showing a sixth embodiment of an acceleration sensor element of this invention.

As shown in FIG. 11, an acceleration sensor element 61 of this embodiment is comprised of a conductive NiO film 42 having a size of 2 mm² and a thickness of 2 μm which also serves as an electrode. On the surface of the conductive NiO film 42, a PZT film 4 is disposed with a size of 0.2 mm² and a thickness of 3 μm. Then, a Ni—Cr electrode film 15 is formed thereon, thereby forming a multilayer film structure. As in Example 4, this sensor is configured in such a way that the multilayer film structure is formed directly on an opening part of a sensor holding substrate 7 made of alumina. Here, sensor holding substrate 7 has a size of 5 mm², a thickness of 1 mm, and the opening part penetrating the central part has a size of 1 mm².

Figure 12:
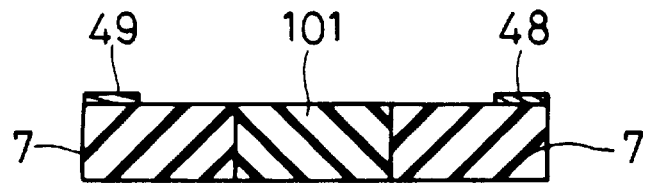
FIG. 12 (a) to (e) are schematic views showing steps of a manufacturing method of an acceleration sensor element in a sixth embodiment of this invention.
Figure 12:
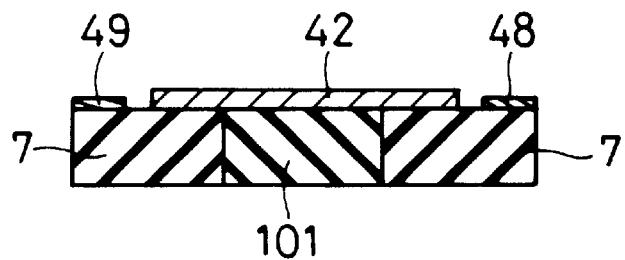
Figure 12:
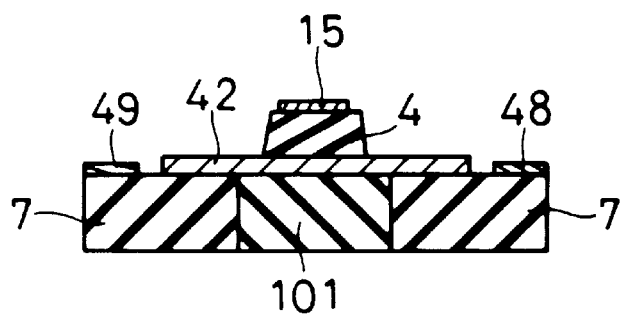
Figure 12:
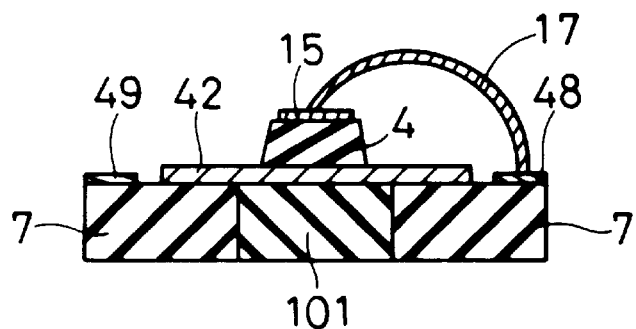
Figure 12:
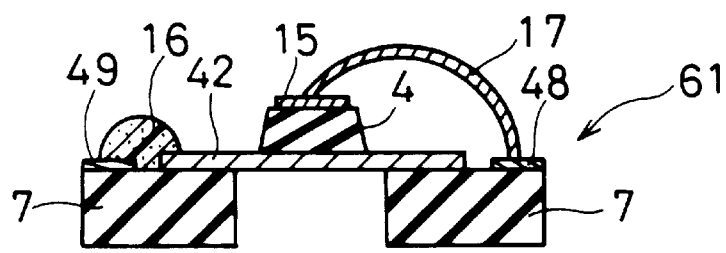

A method of manufacturing the above-configured acceleration sensor element 61 will be explained by referring to FIG. 12 (*a*) to (*e*) which shows the manufacturing steps.

First, a substrate was produced in the same manner as in Example 4. On the surface of this substrate, in the same manner as in Example 3, a rock-salt crystal structure oxide of the conductive NiO film 42 (5 atom % of Li added) (size 2 mm×2 mm, thickness 2 μm) was formed by a plasma MOCVD method whose vertical direction was crystal-oriented to (100) direction against the substrate surface. Then, by means of the same sputtering method as in Example 1, a PZT film was formed by an epitaxial growth into a PZT film 4 (0.2 μm×0.2 μm) which has a thickness of 3 μm and is crystal-oriented to a c-axis on the surface of the conductive NiO film 42. Furthermore, a Ni—Cr electrode film 15 was formed further on the surface. By means of a wire bonding method, an Au wire 17 was used to connect the Ni—Cr electrode film 15 to a connection electrode 48. Then, the above-manufactured structure was washed with water, thereby removing a KBr filled part 101. After being dried, the conductive NiO film 42 was connected by a conductive paste 16 to a connection electrode 49. In this way, the acceleration sensor element 61 was completed.

Although the PZT film 4 which shows pyroelectric characteristics is merely supported by the NiO film 42 of only 2 μm thick, the strength of acceleration sensor element 61 was sufficient. In addition, it was confirmed that electrode discontinuities due to cracks etc. did not occur at all.

As in Example 4, it was also confirmed that acceleration sensor elements with the same performance could be manufactured by using a different alkali halide material instead of KBr, such as KCl, KI, CsBr, and CsI.

EXAMPLE 7

Figure 13:
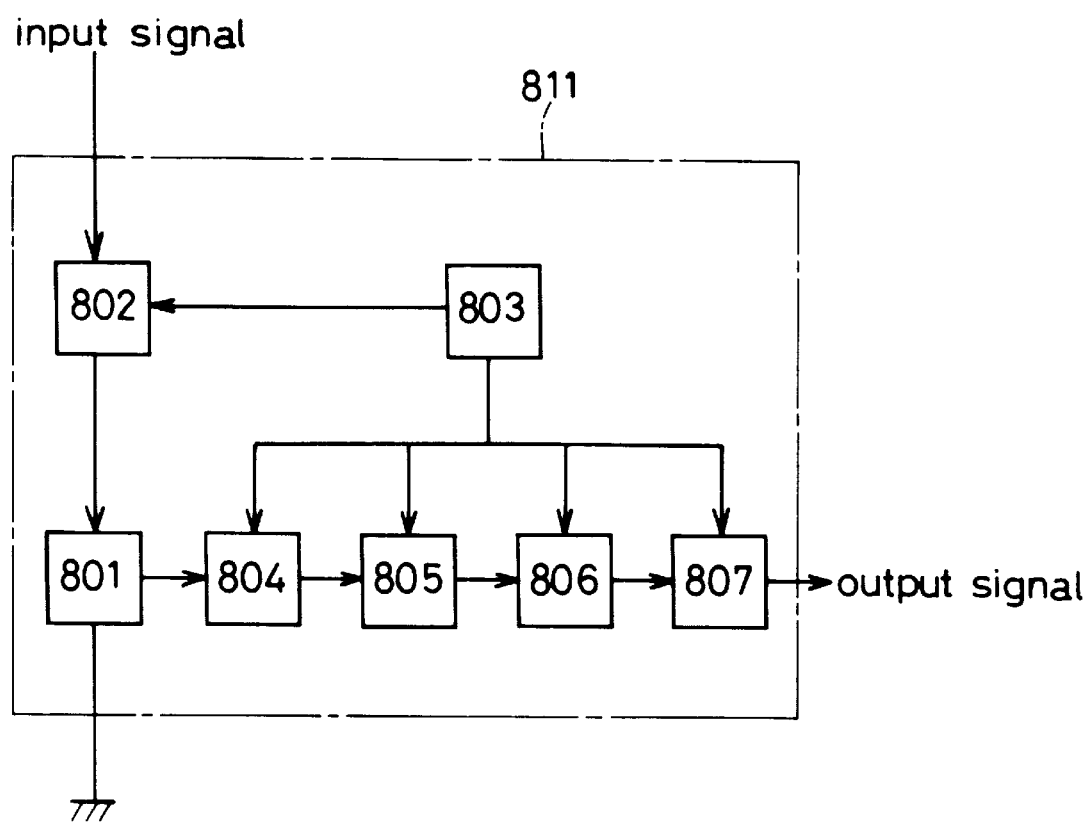
FIG. 13 is a system block chart of an acceleration sensor in a seventh embodiment of this invention.
Figure 14:
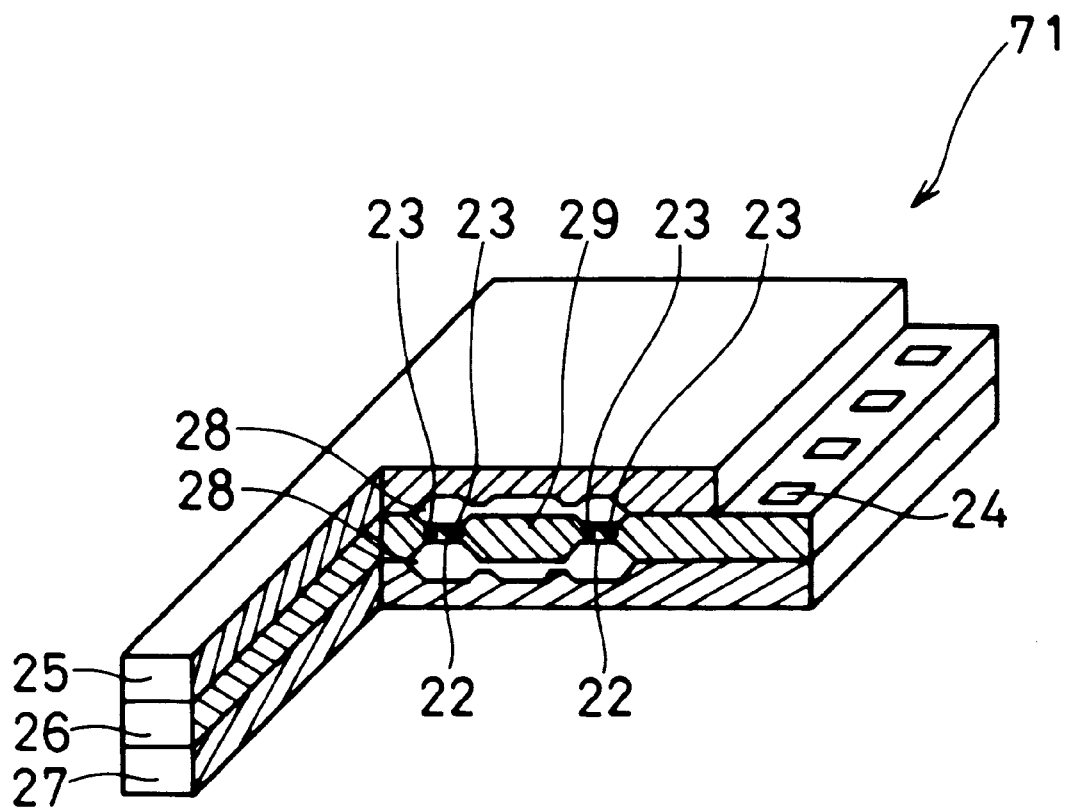
FIG. 14 is a partially cutaway view in perspective showing a conventional semiconductor acceleration sensor element of a curved gage type.
Figure 15:
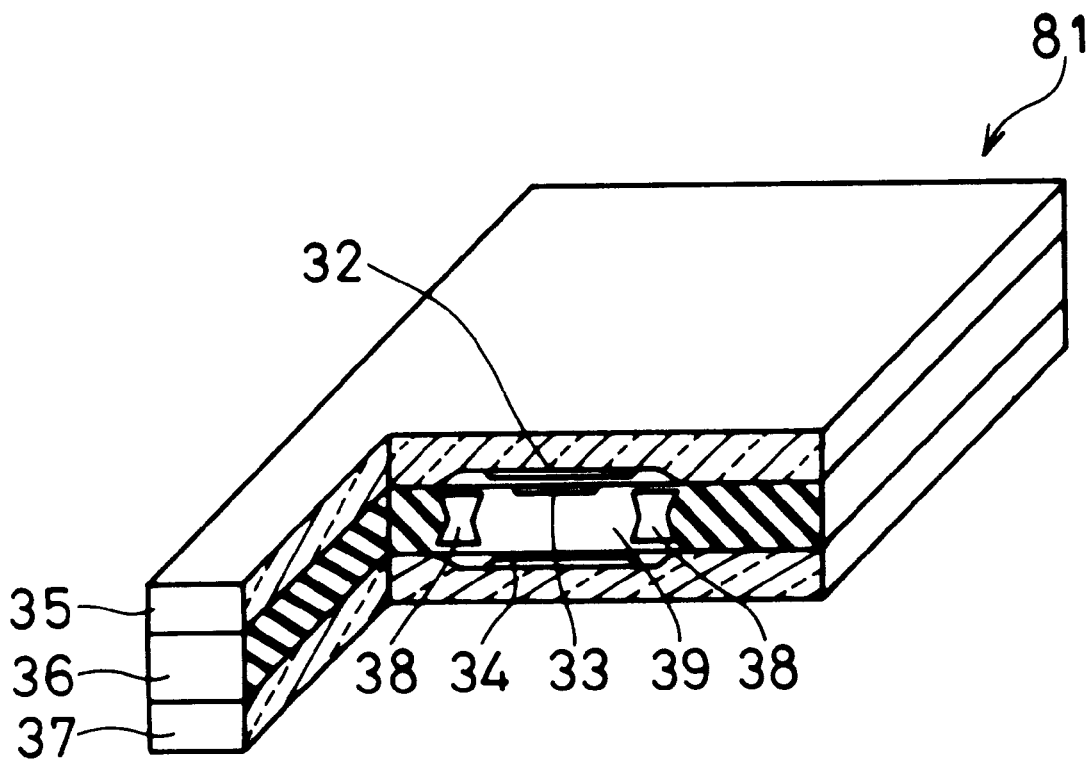
FIG. 15 is a partially cutaway view in perspective showing a conventional semiconductor acceleration sensor element of a capacitance type.

FIG. 13 is a system block chart showing an embodiment of an acceleration sensor. In FIG. 13, reference numeral 801 represents an acceleration sensor element; 802 represents a self-diagnostic signal generating circuit; 803 represents a reference voltage generating circuit; 804 represents a temperature compensating circuit; 805 represents an impedance conversion circuit; 806 represents a filter circuit; 807 represents an amplification circuit; and 811 represents an acceleration sensor. When an acceleration is imposed, an electric charge is generated in accordance with the degree of acceleration in the sensor element 801 having a pyroelectric thin film. Usually, the amount of the generated electric charge is weak and has a wide range of frequency components, so that digital output is conducted by using the impedance conversion circuit 805, the filter circuit 806, and the amplification circuit 807. The self-diagnostic signal generating circuit 802 is disposed to check whether the sensor element 801 and signal processing part are in good order. In addition, the temperature compensating circuit 804 is disposed to control the alternation of an output signal which is caused by a change of temperature in use. According to the above-mentioned structure, a lightweight, self-holding type acceleration sensor was attained which is small, light, highly accurate, and also inexpensive.

As mentioned above, the acceleration sensor elements which were described in the above-noted embodiments of this invention comprises a sensor holding substrate having an opening part and a multilayer film structure adhered thereon at least consisting of an electrode film A, an electrode film B having (100) plane orientation, and a piezoelectic dielectric oxide film present between the electrode film A and the electrode film B. As a result, a thin film sensor element which is small, light, highly accurate, and inexpensive can be attained. In other words, since this invention does not require etching or reinforcement by polyimide resin, it is possible to obtain an extremely small, light, highly accurate, and inexpensive thin film sensor element.

Also, according to the first to the seventh manufacturing methods of this invention, the acceleration sensor element can be manufactured efficiently. For example, the manufacturing method comprises the steps of forming a sensor film on the surface of a water soluble substrate via a holding film and then removing the substrate part by washing in water. As a result, the structure of a lightweight self-holding type accleration sensor element can be manufactured which has reduced size and cost.

Next, the pyroelectric infrared sensor element of this invention will be explained.

EXAMPLE 8

By referring to FIGS. 16 and 17 (*a*) to (*f*), a first embodiment of a pyroelectric infrared sensor element of this invention and of a manufacturing method of this pyroelectric infrared sensor element will be described.

Figure 16:
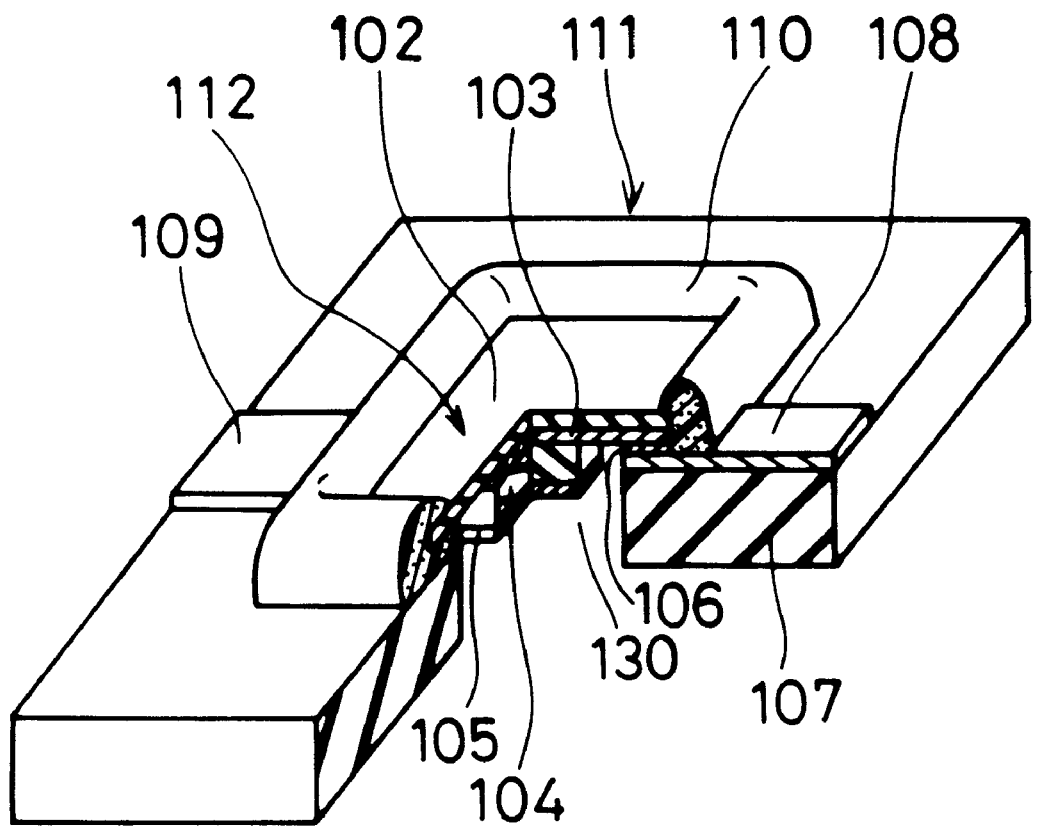
FIG. 16 is a partially cutaway view in perspective showing a first embodiment of a pyroelectric infrared element of this invention.

FIG. 16 shows a perspective view of the pyroelectric infrared sensor element in the first embodiment. As shown in FIG. 16, a pyroelectric infrared sensor element 111 is configured such that a multilayer film structure 112 is fixed on the surface of a ceramic substrate 107 by an adhesive 110, and the ceramic substrate 107 has an opening part 130 of a schematic rectangular cross-section near the center.

In this example, it is assumed that the ceramic substrate 107 has a rectangular form of 5 mm×5 mm, a thickness of 1 mm, the opening part 130 of 1 mm×1 mm near the center, and is made of alumina. The multilayer film structure 112 is comprised of a rock-salt crystal structure oxide film 102 of MgO oriented to (100) plane (hereinafter abbreviated as MgO film 102), a lead electrode film 103 of Pt oriented to (100) plane which is disposed under the MgO film 102, a pyroelectric dielectric oxide film 104 of titanate lead lanthanum as a dielectric material which is disposed at a predetermined place under the lead electrode film 103 (hereinafter abbreviated as PLT film 104), and a lead electrode 105 which is disposed under the PLT film 104. The part of the PLT film 104 is positioned to fit into the opening part 130 of the ceramic substrate 107. It is assumed that the PLT film 104 has a size of 0.2 mm×0.2 mm and a thickness of 3 μm. Furthermore, the MgO film 102 has a size of 2 mm×2 mm and a thickness of 2 μm. At predetermined surface parts of the ceramic substrate 107, there are connection electrodes 108 and 109 disposed which are respectively connected to the lead electrode films 103 and 105 via a conductive adhesive 106.

Figure 17:
FIG. 17 (a) to (f) are schematic views showing steps of a manufacturing method of a pyroelectric infrared element in a first embodiment of this invention.
Figure 17:
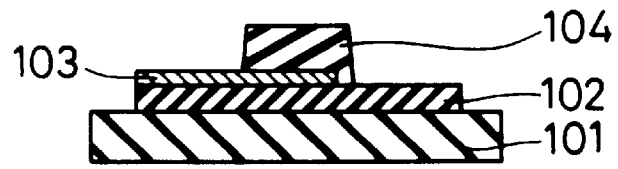
Figure 17:
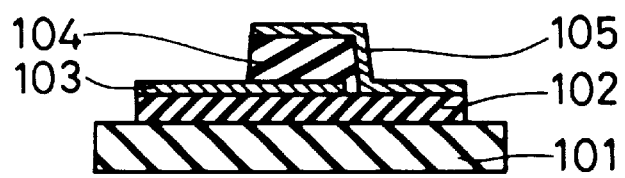
Figure 17:
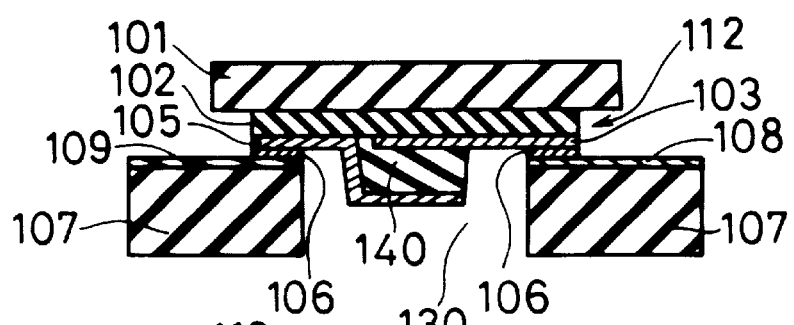
Figure 17:
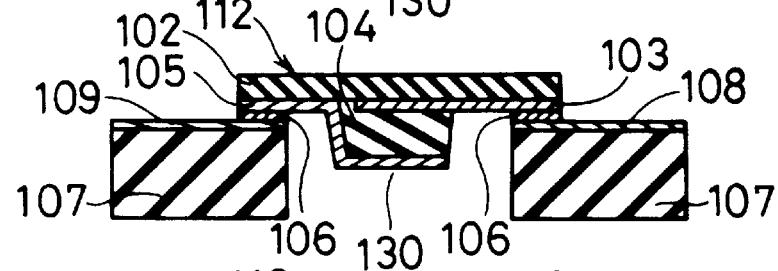
Figure 17:
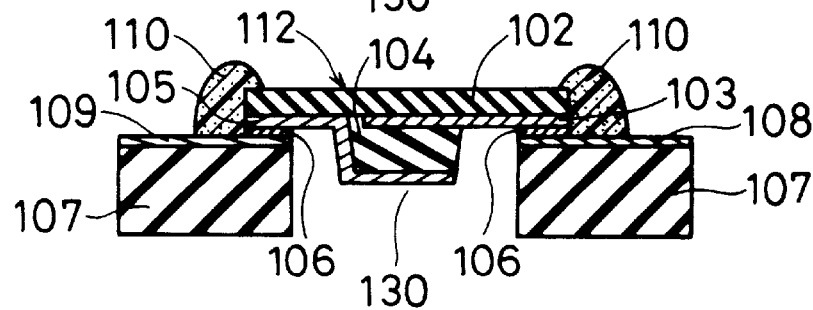

FIG. 17 (a) to (f) shows a method of manufacturing the pyroelectric infrared sensor element 111 configured above. First, KBr powder material was press-molded with 800 kgf/cm$^2$ under reduced pressure, and the surface was smoothed by polishing. Thus, a flat plate KBr substrate 101 was formed with a size of 3 mm×3 mm and a thickness of 0.5 mm. Next, on the surface of this substrate 101, a rock-salt crystal structure oxide of the MgO film 102 (size 2 mm×2 mm, thickness 2 μm) was formed by a plasma MOCVD method whose vertical direction was crystal-oriented to (100) direction against the substrate surface (FIG. 17 (a)).

In order to form the MgO film 102, a vapor of magnesium acetylacetonate was used as a CVD raw material gas, and the KBr substrate 101 was heated at 400° C. Furthermore, by means of a sputtering method, a Pt film was formed by an epitaxial growth at a predetermined surface part of this MgO film 102, and the lead electrode film 103 of the Pt film which was crystal-oriented to (100) direction against the film surface (FIG. 17 (b)). Then, as also mentioned in the manufacturing method of a conventional pyroelectric infrared sensor element, a rf magnetron sputtering method was used to form a PLT film 104 with a thickness of 3 μm which was crystal-oriented to a c-axis. The PLT film 104 was formed at a predetermined surface part of the lead electrode 103 and also at a predetermined surface part of the Mgo film 102 where the lead electrode 103 was not formed (FIG. 17 (b)). Then, on the surface of the PLT film 104 and also on the surface of the MgO film 102 where the lead electrode 103 was not formed, the lead electrode film 105 of a Ni Cr film was formed by a sputtering method (FIG. 17 (c)).

Next, by burning Pd paste, the ceramic substrate 107 was prepared on which connection electrodes 108 and 109 had been formed in advance at predetermined parts. The multilayer film structure 112 disposed on top of the KBr substrate 101 which was formed in the above-mentioned steps was reversed. It was placed in such a way that the multilayer film structure 112 covered the opening part 130 of the ceramic substrate 107, and also so that the lead electrode films 103 and 105 were respectively in contact with the connection electrodes 108 and 109. In this condition, the conductive adhesive 106 was applied (FIG. 17 (d)). Then, the above-manufactured structure was washed with water, thereby removing the KBr substrate 101 (FIG. 17 (e)). After being dried, the circumference part of the MgO film 102 and the surface of the ceramic substrate 107 were bonded for reinforcement by an epoxy resin type adhesive 110. In this way, the pyroelectric infrared sensor element 111 was completed (FIG. 17 (f)).

In the pyroelectric infrared sensor element 111 obtained according to the above-noted method, the PLT film 104 which shows pyroelectric properties is merely supported by the MgO film 102 of only 2 μm thick. However, when this sensor element was compared with the conventional pyroelectric infrared sensor element in which a PLT film is supported by a polyimide resin film, the MgO film 102 was thinner and harder than the polyimide resin film, and also the rate of contraction was approximately the same with the PLT film 104. As a result, it was confirmed that the mechanical strength was sufficient, and that electrode discontinuity due to cracks etc. did not occur at all.

Furthermore, instead of the MgO film 102 of the rock-salt crystal structure oxide which was crystal-oriented to (100) direction, a NiO film or a CoO film could be used as well which were crystal-oriented to (100) direction, and which were manufactured by a plasma MOCVD method with use of a raw material gas of nickel acetylacetonate and cobalt acetylacetonate. Also in this case, it was confirmed that pyroelectric infrared sensor elements having the same performance could be manufactured.

In addition, it was confirmed that pyroelectric infrared sensor elements with the same performance could be manufactured by using a different substrate instead of the KBr substrate 101, which also belongs to alkali halide materials, such as KCl, KI, CsBr, and CsI.

EXAMPLE 9

By referring to FIGS. 18 and 19 (a) to (e), a second embodiment of a pyroelectric infrared sensor element of this invention and of a manufacturing method of this pyroelectric infrared sensor element will be described.

Figure 18:
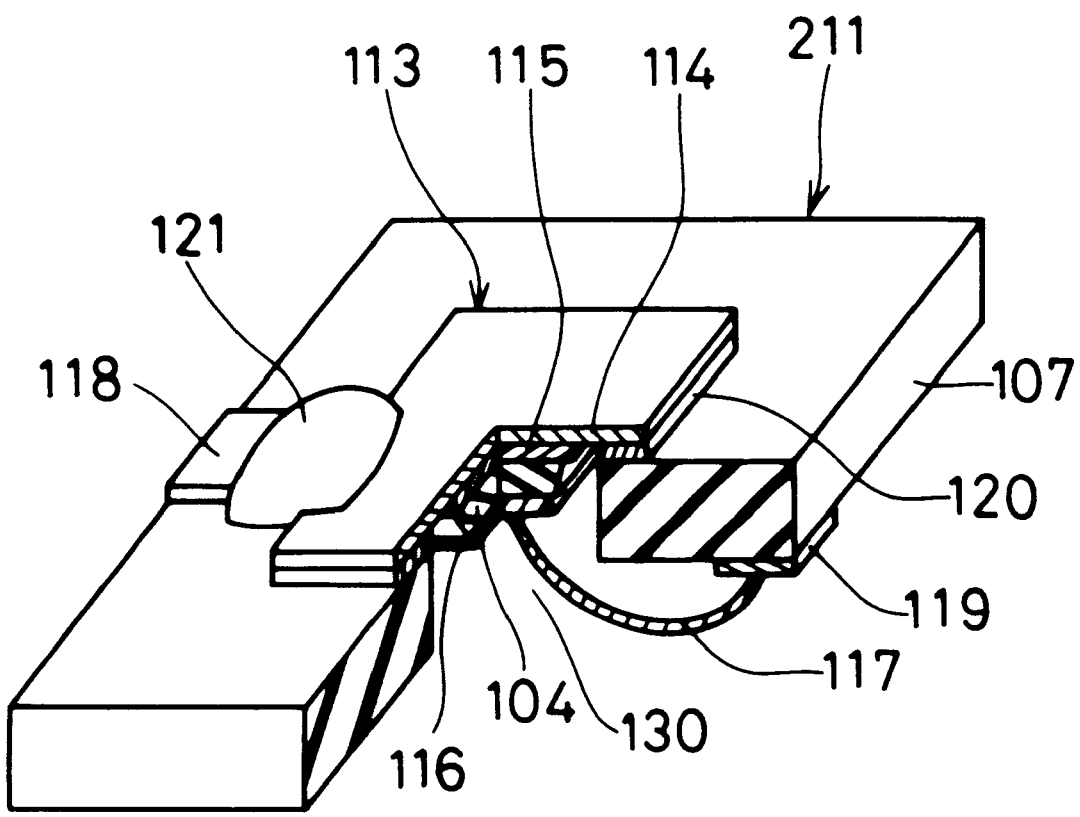
FIG. 18 is a partially cutaway view in perspective showing a second embodiment of a pyroelectric infrared element of this invention.

FIG. 18 shows a perspective view of the pyroelectric infrared sensor element in the second embodiment. In FIG. 18, members having the same reference numerals as in the first embodiment shown in FIGS. 16 and 17 (a) to (f) are substantially the same.

As shown in FIG. 18, a pyroelectric infrared sensor element 211 is configured such that a multilayer film structure 113 is fixed on the surface of a ceramic substrate 107 by an adhesive 120, and so that the ceramic substrate 107 has an opening part 130 of a schematic rectangular cross-section near the center. The multilayer film structure 113 is comprised of a Ni metal electrode film 114, a conductive NiO electrode film 115 oriented to (100) plane which is disposed under the Ni metal electrode film 114, a PLT film 104 disposed under the conductive NiO electrode film 115 at a predetermined part, and a Ni—Cr electrode film 116 which is disposed under the PLT film 104. The part of the PLT film 104 is positioned to fit into the opening part 130. The Ni metal electrode film 114 has a size of 2 mm×2 mm and a thickness of 0.8 μm. The conductive NiO film 112 has a size of 0.6 mm×0.6 mm and a thickness of 0.4 μm. Furthermore, the PLT film 4 has a size of 0.2 mm×0.2 mm and a thickness of 3 μm. The ceramic substrate 107 which is made of alumina as in Example 8 has a size of 5 mm×5 mm, a thickness of 1 mm, and an opening part of 1 mm×1 mm near the center. As for the ceramic substrate 107, other kinds of ceramics such as glass, mullite, cordierte, strontium titanate, magnesia (MgO), and silicon can be used as well. At a predetermined part of the ceramic substrate 107, also on the same side where the multilayer film structure 113 is adhered, a connection electrode 118 is formed to be connected to the Ni metal electrode film 114 via a conductive adhesive 121. Moreover, at a predetermined part of the ceramic substrate 107 on the opposite side, a connection electrode 119 is formed to be connected to the Ni—Cr electrode film 116 via an Au wire 117.

Figure 19:
FIG. 19 (a) to (e) are schematic views showing steps of a manufacturing method of a pyroelectric infrared element in a second embodiment of this invention.
Figure 19:
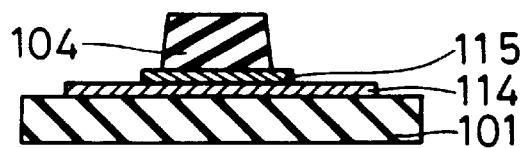
Figure 19:
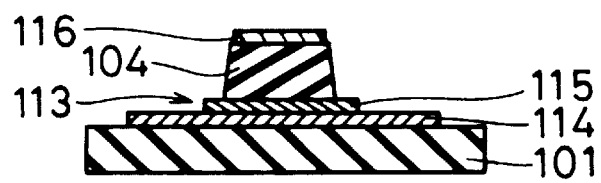
Figure 19:
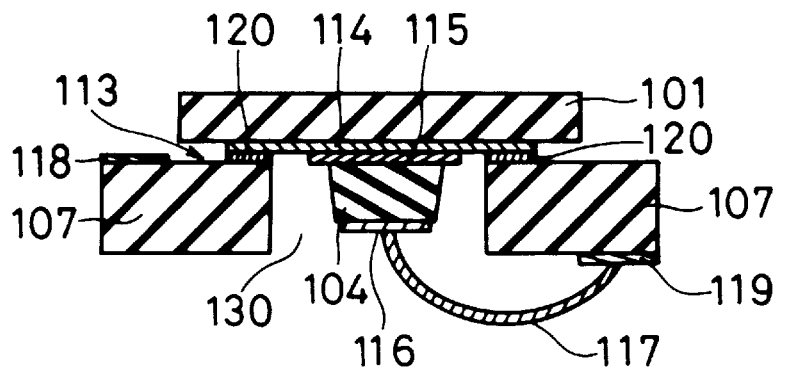
Figure 19:
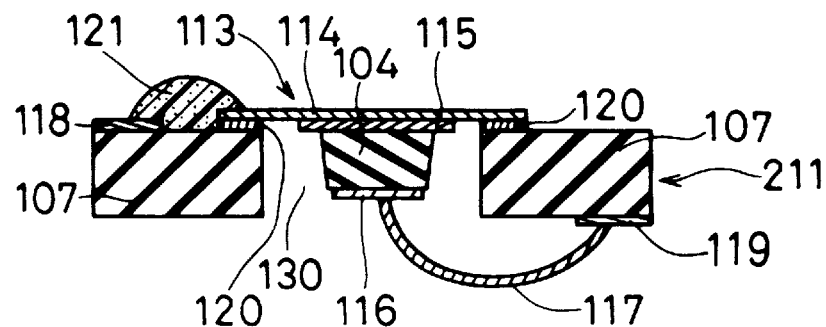

FIG. 19 (*a*) to (*e*) shows a method of manufacturing the pyroelectric infrared sensor element 211 configured above. First, a flat plate KBr substrate 101 is formed in the same manner as in Example 8 mentioned above with a size of 3 mm×3 mm and a thickness of 0.5 mm. Next, on the surface of this KBr substrate 101, the metal Ni film 114 is formed by a rf sputtering method with a size of 2 mm×2 mm and a thickness of 0.8 $\mu$m. Then, on the surface of the metal Ni film 114, a rock-salt crystal structure oxide of the NiO film 115 (Li added) (size 0.6 mm×0.6 mm, thickness 0.4 $\mu$m) was formed by a plasma MOCVD method whose vertical direction was crystal-oriented to (100) direction against the substrate surface (FIG. 19 (*a*)). In order to form the conductive NiO film 115, mixture of magnesium acetylacetonate vapor and Li-dipivaloylmethanechelate vapor was used as CVD raw material gas, and the KBr substrate 101 was heated at 400° C. Then, on the surface of the conductive NiO film 115, as also mentioned in the manufacturing method of a conventional pyroelectric infrared sensor element, a rf magnetron sputtering method was used to form the PLT film 104 (0.2 $\mu$m×0.2 $\mu$m) by an epitaxial growth of the PLT film to be 3 $\mu$m thick and to be crystal-oriented to a c-axis (FIG. 19 (*b*)). On the surface of the PLT film 104, the Ni—Cr electrode film 116 was formed by a sputtering method (FIG. 19 (*c*)).

Next, by burning Pd paste, the ceramic substrate 107 was prepared on which the connection electrodes 118 and 119 had been formed respectively in advance at predetermined parts. The multilayer film structure 113 disposed on top of the KBr substrate 101 which was formed in the above-mentioned steps was reversed. It was placed in such a way that the multilayer film 113 covered the opening part 130 of the ceramic substrate 107, and the conductive adhesive 120 was applied (FIG. 19 (*d*)). Then, a wire bonding method was applied to connect the Ni—Cr electrode film 116 via the Au wire 117 to the connection electrode 119 formed on the surface of the ceramic substrate 107 (FIG. 19 (*d*)). Next, the above-manufactured structure was washed with water, thereby removing the KBr substrate 101. After being dried, the metal Ni film 114 is connected by the conductive paste 121 to the connection electrode 118 formed on the surface of the ceramic substrate 107. In this way, the pyroelectric infrared sensor element 211 was completed (FIG. 19 (*e*)).

In the pyroelectric infrared sensor element 211 obtained according to the above-noted method, the PLT film 104 which shows pyroelectric properties is merely supported by the metal Ni film 114 of only 0.8 $\mu$m thick. However, when this sensor element was compared with the conventional pyroelectric infrared sensor element in which a PLT film is supported by a polyimide resin film, the metal Ni film 114 was thinner and harder than the polyimide resin film, and also a rate of contraction was approximately the same with the PLT film 104. As a result, it was confirmed that the mechanical strength was sufficient, and that electrode discontinuity due to cracks etc. did not occur at all.

The same as in the first embodiment mentioned above, it was confirmed that pyroelectric infrared sensor elements with the same performance could be manufactured by using a different substrate instead of the KBr substrate 101, which also belongs to alkali halide materials, such as KCl, KI, CsBr, and CsI.

EXAMPLE 10

By referring to FIGS. 20 and 21 (*a*) to (*e*), a third embodiment of a pyroelectric infrared sensor element of this invention and of a manufacturing method of this pyroelectric infrared sensor element will be described.

Figure 20:
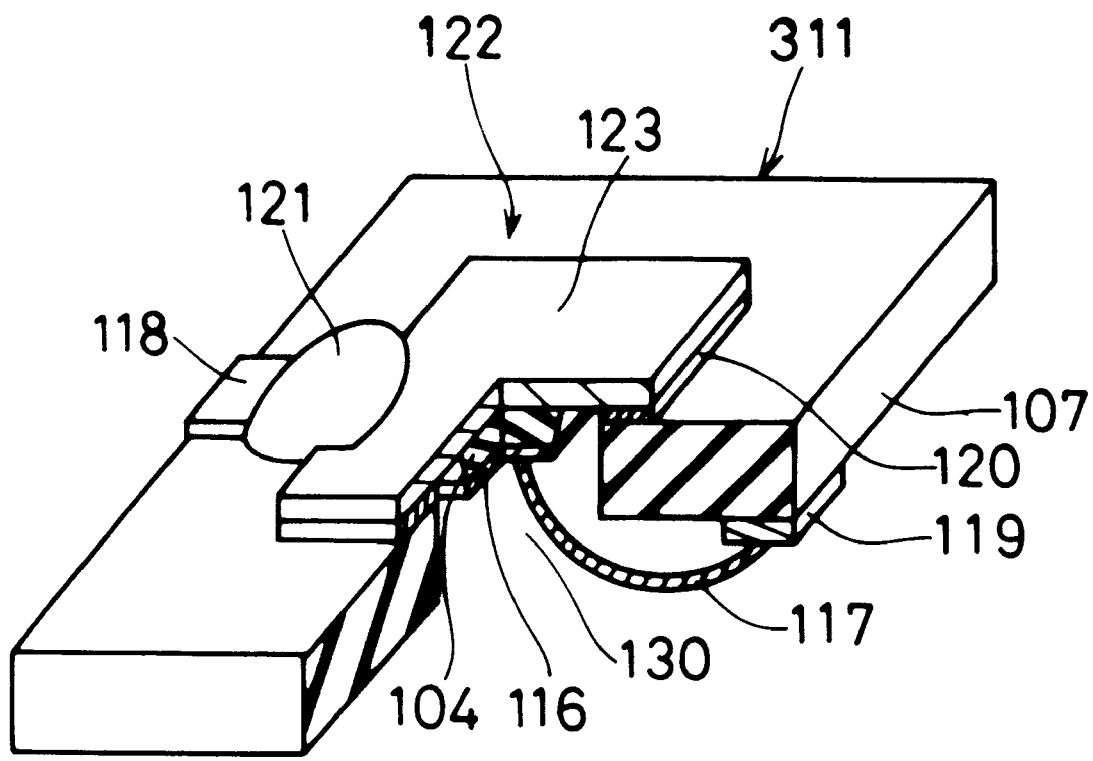
FIG. 20 is a partially cutaway view in perspective showing a third embodiment of a pyroelectric infrared element of this invention.

FIG. 20 shows a perspective view of the pyroelectric infrared sensor element in the third embodiment. In FIG. 20, members having the same reference numerals as in the first embodiment shown in FIGS. 16 and 17 (*a*) to (*f*) or in the second embodiment shown in FIGS. 18 and 19 (*a*) to (*e*) are substantially the same.

As shown in FIG. 20, a pyroelectric infrared sensor element 311 in the third embodiment is configured such that a multilayer film 122 is fixed on the surface of a ceramic substrate 107 by an adhesive 120, and that ceramic substrate 107 has an opening part 130 of a schematic rectangular cross-section near the center. The multilayer film 122 is comprised of a conductive NiO film 123 which also serves as an electrode, a PLT film 104 disposed under the conductive NiO film 123, and a Ni—Cr electrode film 116 which is disposed under the PLT film 104. The part of the PLT film 104 is positioned to fit into the opening part 130. The conductive NiO film 123 has a size of 2 mm×2 mm and a thickness of 2 $\mu$m, and the PLT film 104 has a size of 0.2 mm×0.2 mm and a thickness of 3 $\mu$m. The ceramic substrate 107 which is made of alumina as in Example 8 has a size of 5 mm×5 mm, a thickness of 1 mm, and an opening part of 1 mm×1 mm near the center. At a predetermined part of the ceramic substrate 107, also on the same side where the multilayer film 122 is adhered, a connection electrode 118 is formed to be connected to the Ni metal electrode film 114 via a conductive adhesive 121. Moreover, at a predetermined part of the ceramic substrate 107 on the opposite side, a connection electrode 119 is formed to be connected to the Ni—Cr electrode film 116 via an Au wire 117.

Figure 21:
FIG. 21 (a) to (e) are schematic views showing steps of a manufacturing method of a pyroelectric infrared element in a third embodiment of this invention.
Figure 21:
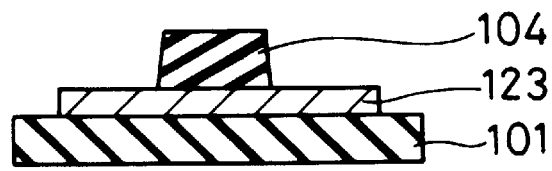
Figure 21:
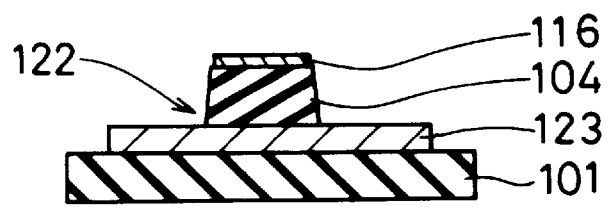
Figure 21:
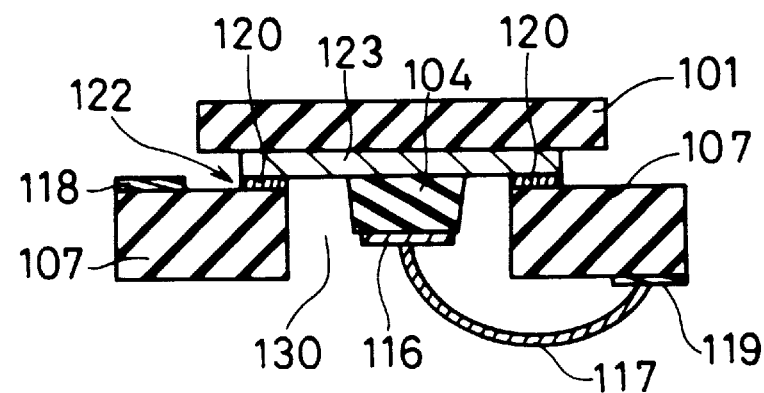
Figure 21:
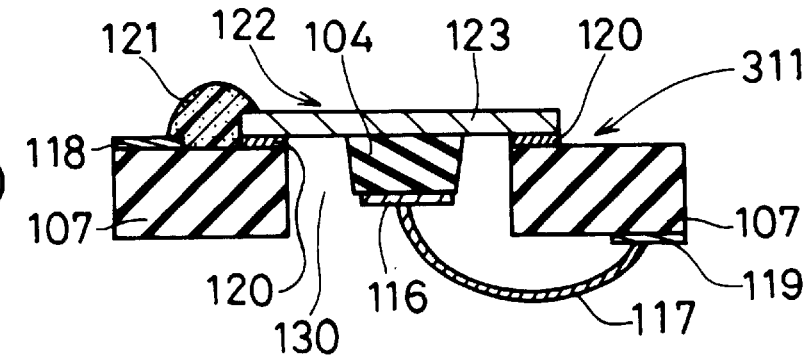

FIG. 21 (*a*) to (*e*) shows a method of manufacturing the pyroelectric infrared sensor element 311 configured above. First, a flat plate KBr substrate 101 is formed in the same manner as in Example 8 mentioned above with a size of 3 mm×3 mm and a thickness of 0.5 mm. Next, as in Example 9, a rock-salt crystal structure oxide of the conductive NiO film 123 (Li added) was formed (size 2 mm×2 mm, thickness 2 $\mu$m) on the surface of this KBr substrate 101 by a plasma MOCVD method. The vertical direction of the conductive NiO film 123 was crystal-oriented to (100) direction against the surface of the substrate 101 (FIG. 21 (*a*)). Then, the same sputtering method as in the first embodiment was used to form the PLT film 104 (0.2 $\mu$m×0.2 $\mu$m) on the surface of the conductive NiO film 123 by an epitaxial growth of the PLT film to be 3 $\mu$m thick and to be crystal-oriented to a c-axis (FIG. 21 (*b*)). Furthermore, the Ni—Cr electrode film 116 was formed on the surface of the PLT film 104 (FIG. 21 (*c*)).

Next, by burning Pd paste, the ceramic substrate 107 was prepared on which the connection electrodes 118 and 119 had been formed in advance at predetermined parts. The multilayer film structure 122 disposed on top of the KBr substrate 101 which was formed in the above-mentioned steps was reversed. It was placed in such a way that the multilayer film 122 covered the opening part 130 of the ceramic substrate 107, and the conductive adhesive 120 was applied (FIG. 21 (*d*)). Then, a wire bonding method was applied to connect the Ni—Cr electrode film 116 via the Au wire 117 to the connection electrode 119 formed on the surface of the ceramic substrate 107 (FIG. 21 (*d*)). Next, the above-manufactured structure was washed with water, thereby removing the KBr substrate 101. After being dried, the metal Ni film 114 is connected by the conductive paste 121 to the connection electrode 118 formed on the surface of the ceramic substrate 107. In this way, the pyroelectric infrared sensor element 311 was completed (FIG. 21 (e)).

In the pyroelectric infrared sensor element 311 obtained according to the above-noted method, the PLT film 104 which shows pyroelectric properties is merely supported by the NiO film 123 of only 2 μm thick. However, when this sensor element was compared with the conventional pyroelectric infrared sensor element in which a PLT film is supported by a polyimide resin film, the NiO film 123 was thinner and harder than the polyimide resin film, and also a rate of contraction was approximately the same with the PLT film 104. As a result, it was confirmed that the mechanical strength was sufficient, and that electrode discontinuity due to cracks etc. did not occur at all.

Furthermore, the same as in the first embodiment mentioned above, it was confirmed that pyroelectric infrared sensor elements with the same performance could be manufactured by using a different substrate instead of the KBr substrate 101, which also belongs to alkali halide materials, such as KCl, KI, CsBr, and CsI.

EXAMPLE 11

By referring to FIGS. 22 and 23 (a) to (f), a fourth embodiment of a pyroelectric infrared sensor element of this invention and of a manufacturing method of this pyroelectric infrared sensor element will be described.

Figure 22:
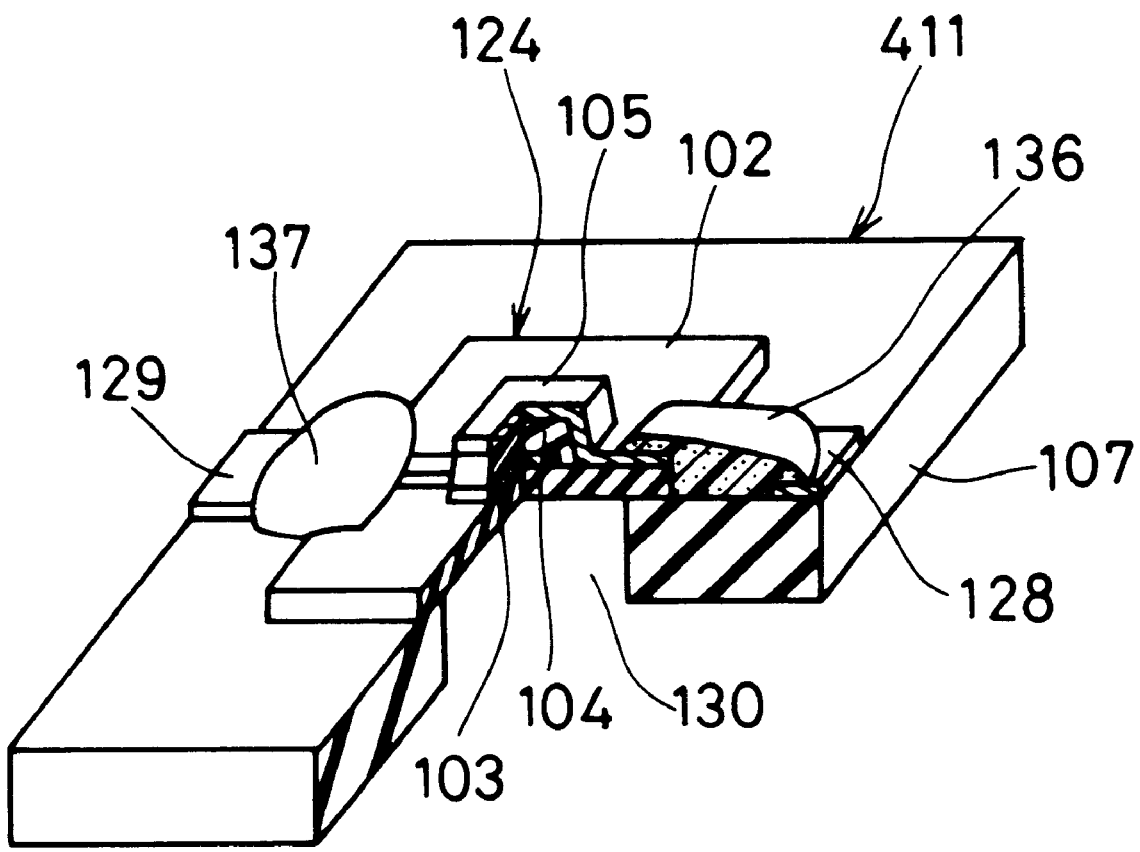
FIG. 22 is a partially cutaway view in perspective showing a fourth embodiment of a pyroelectric infrared element of this invention.

FIG. 22 shows a perspective view of the pyroelectric infrared sensor element in the fourth embodiment. In FIG. 22, members having the same reference numerals as in the first embodiment shown in FIGS. 16 and 17 (a) to (f) are substantially the same. As shown in FIG. 22, a pyroelectric infrared sensor element 411 in the fourth embodiment is configured such that a multilayer film 124 is formed directly on the surface of a ceramic substrate 107, and that the ceramic substrate 107 has an opening part 130 of a schematic rectangular cross-section near the center. As in Example 8, it is assumed in this example that the ceramic substrate 107 has a rectangular form of 5 mm×5 mm, a thickness of 1 mm, the opening part 130 of 1 mm×1 mm near the center, and is made of alumina. The multilayer film 124 is comprised of a MgO film 102, a lead electrode film 103 which is disposed under the MgO film 102, a PLT film 104 which is disposed at a predetermined part of the surface of the lead electrode film 103, and a lead electrode film 105 disposed above the PLT film 104. The part of the PLT film 104 is positioned to fit into the opening part 130. The PLT film 104 has a size of 0.2 mm×0.2 mm and a thickness of 3 μm, and the MgO film 102 has a size of 2 mm×2 mm and a thickness of 2 μm. At a predetermined part of the ceramic substrate 107, the connection electrodes 128 and 129 are disposed. The lead electrode 105 is connected to the connection electrode 128 via a conductive paste 136, and the lead electrode 103 is connected to the connection electrode 129 via a conductive paste 137.

Figure 23:
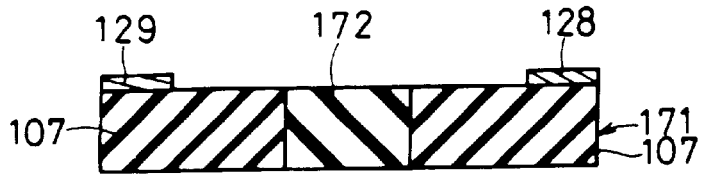
FIG. 23 (a) to (f) are schematic views showing steps of a manufacturing method of a pyroelectric infrared element in a fourth embodiment of this invention.
Figure 23:
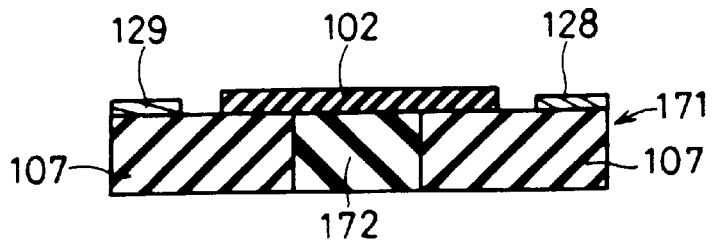
Figure 23:
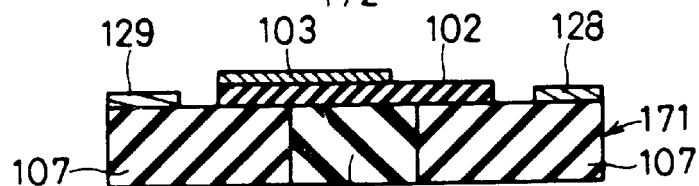
Figure 23:
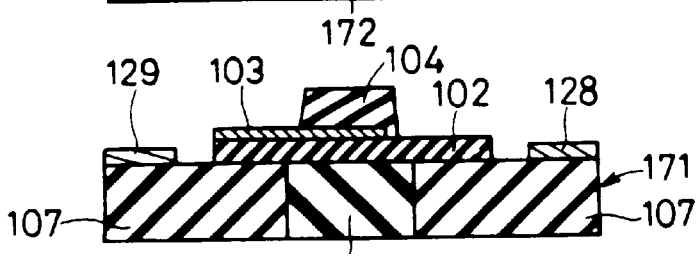
Figure 23:
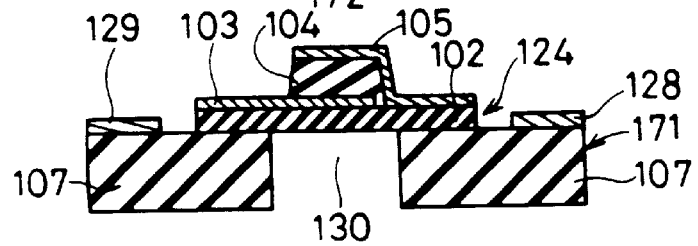
Figure 23:
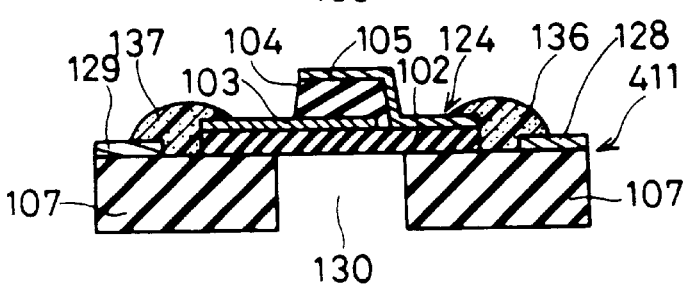

FIG. 23 (a) to (f) shows a method of manufacturing the pyroelectric infrared sensor element 411 configured above. Before starting the process, the ceramic substrate 107 made of alumina was prepared which had a size of 5 mm×5 mm, a thickness of 1 mm, and the opening part 130 penetrating near the center with a size of 1 mm×1 mm. This substrate was applied in advance with Pd paste at a predetermined surface and was burned at 1050° C. to form the connection electrodes 128 and 129. After filling KBr powder into the opening part 130 of the ceramic substrate 107 and hardening the powder, KBr was heated at 740° C. under reduced pressure and melted. In this way, the ceramic substrate 171 having a filled opening part is formed (FIG. 23 (a)). Here, a KBr filled part 172 was smoothed by polishing the surface. As in Example 8, a rock-salt crystal structure oxide of the MgO film 102 (size 2 mm×2 mm, thickness 2 μm) was formed on the surface of the substrate 171 having KBr filled part 172 by a plasma MOCVD method. The vertical direction of the MgO film 102 was crystal-oriented to (100) direction against the surface of the substrate (FIG. 23 (b)). Then, a sputtering method was used to form a Pt film at a predetermined part of the surface of the MgO film 102 by an epitaxial growth, and the lead electrode film 103 of a Pt film was formed which was crystal-oriented to (100) direction against the film surface (FIG. 23 (b)). Then, a rf magnetron sputtering method was used to form a PLT film 104 with a thickness of 3 μm which was crystal-oriented to a c-axis. The PLT film 104 was formed at a predetermined surface part of the lead electrode 103 and also at a predetermined surface part of the MgO film 102 where the lead electrode film 103 was not formed (FIG. 23 (b)). Then, on the surface of the PLT film 104 and also on the rest of the surface of the MgO film 102 where the lead electrode 103 was not formed, the drawer electrode film 105 of a Ni—Cr film was formed (FIG. 23 (e)). Next, the above-manufactured structure was washed with water, thereby removing the KBr filled part 172 (FIG. 23 (e)). After being dried, the lead electrode film 103 was connected to the connection electrode 129 by the conductive paste 137, and the lead electrode film 105 was connected to the connection electrode 128 by the conductive paste 136. In this way, the pyroelectric infrared sensor element 411 was completed (FIG. 23 (f)).

In the pyroelectric infrared sensor element 411 obtained according to the above-noted method, the PLT film 104 which shows pyroelectric properties is merely supported by the MgO film 102 of only 2 μm thick. However, when this sensor element was compared with the conventional pyroelectric infrared sensor element in which a PLT film is supported by a polyimide resin film, the MgO film 102 was thinner and harder than the polyimide resin film, and also a rate of contraction was approximately the same with the PLT film 4. As a result, it was confirmed that the mechanical strength was sufficient, and that electrode discontinuity due to cracks etc. did not occur at all.

Furthermore, it was confirmed that pyroelectric infrared sensor elements having the same performance could be manufactured by using a NiO film or a CoO film instead of the MgO film 102 which was crystal-oriented to (100) direction, and which was manufactured by a plasma MOCVD method with use of raw material gas of nickel acetylacetonate and cobalt acetylacetonate. In addition, it was confirmed that pyroelectric infrared sensor elements with the same performance could be manufactured by using a different powder instead of KBr powder, which also belongs to alkali halide materials, such as KCl, KI, CsBr, and CsI.

EXAMPLE 12

By referring to FIGS. 24 and 25 (a) to (e), a fifth embodiment of a pyroelectric infrared sensor element of this invention and of a manufacturing method of this pyroelectric infrared sensor element will be described.

Figure 24:
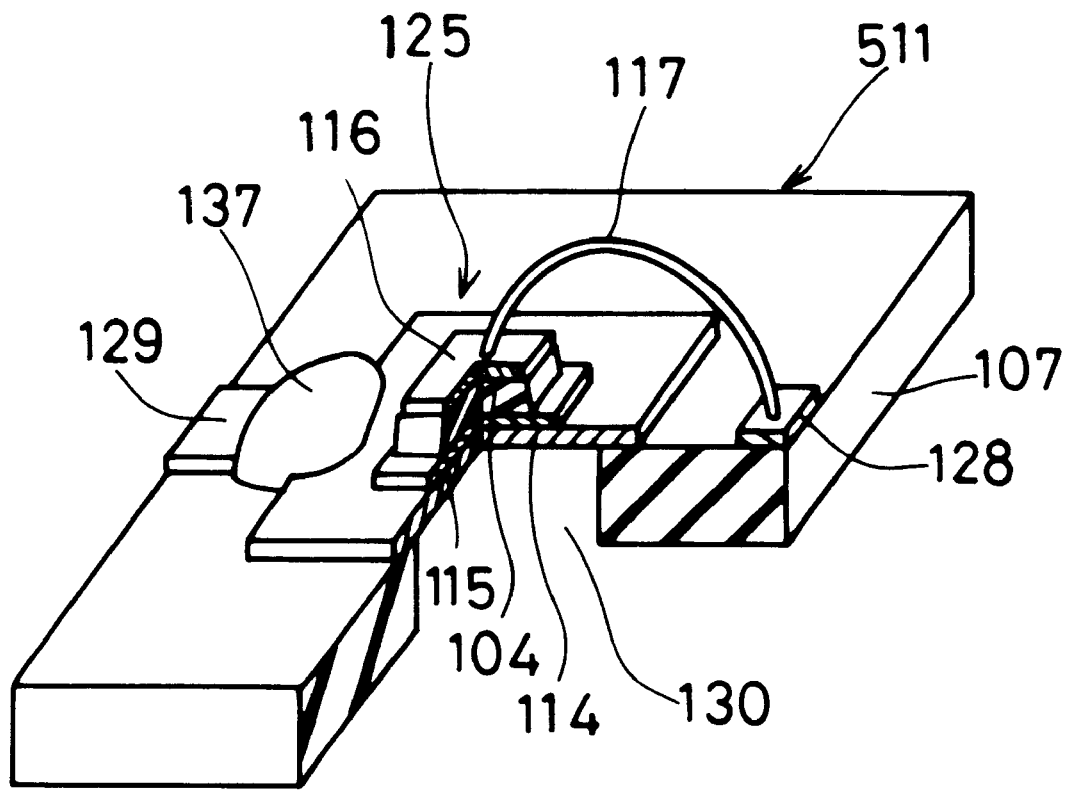
FIG. 24 is a partially cutaway view in perspective showing a fifth embodiment of a pyroelectric infrared element of this invention.

FIG. 24 shows a perspective view of the pyroelectric infrared sensor element in the fifth embodiment. In FIG. 24, members having the same reference numerals as in the above-mentioned embodiments are substantially the same. As shown in FIG. 24, a pyroelectric infrared sensor element 511 in the fifth embodiment is configured such that a multilayer film 125 is formed directly on the surface of a ceramic substrate 107, and that the ceramic substrate 107 has an opening part 130 of a schematic rectangular cross-section near the center. As in the above-mentioned embodiments, it is assumed in this example that the ceramic substrate 107 has a rectangular form of 5 mm×5 mm, a thickness of 1 mm, the opening part 130 of 1 mm×1 mm near the center, and is made of alumina. The multilayer film structure 125 is comprised of a metal Ni film 114 which also serves as an electrode, a conductive NiO film 115 which is disposed on top of the metal Ni film 114, a PLT film 104 which is disposed at a predetermined part of the surface of the conductive NiO film 115, and a Ni—Cr electrode film 116 disposed above the PLT film 104. The part of the PLT film 104 is positioned to be on top of the opening part 130. The metal Ni film 114 has a size of 2 mm×2 mm and a thickness of 0.8 μm, and the conductive NiO film 115 has a size of 0.6 mm×0.6 mm and a thickness of 0.4 μm. In addition, the PLT film 104 has a size of 0.2 mm×0.2 mm and a thickness of 3 μm. At a predetermined surface part of the ceramic substrate 107, the connection electrodes 128 and 129 are disposed. The connection electrode 129 is connected to the metal Ni film 114 via a conductive paste 137, and the connection electrode 128 is connected to the Ni—Cr electrode film 116 via an Au wire 117.

Figure 25:
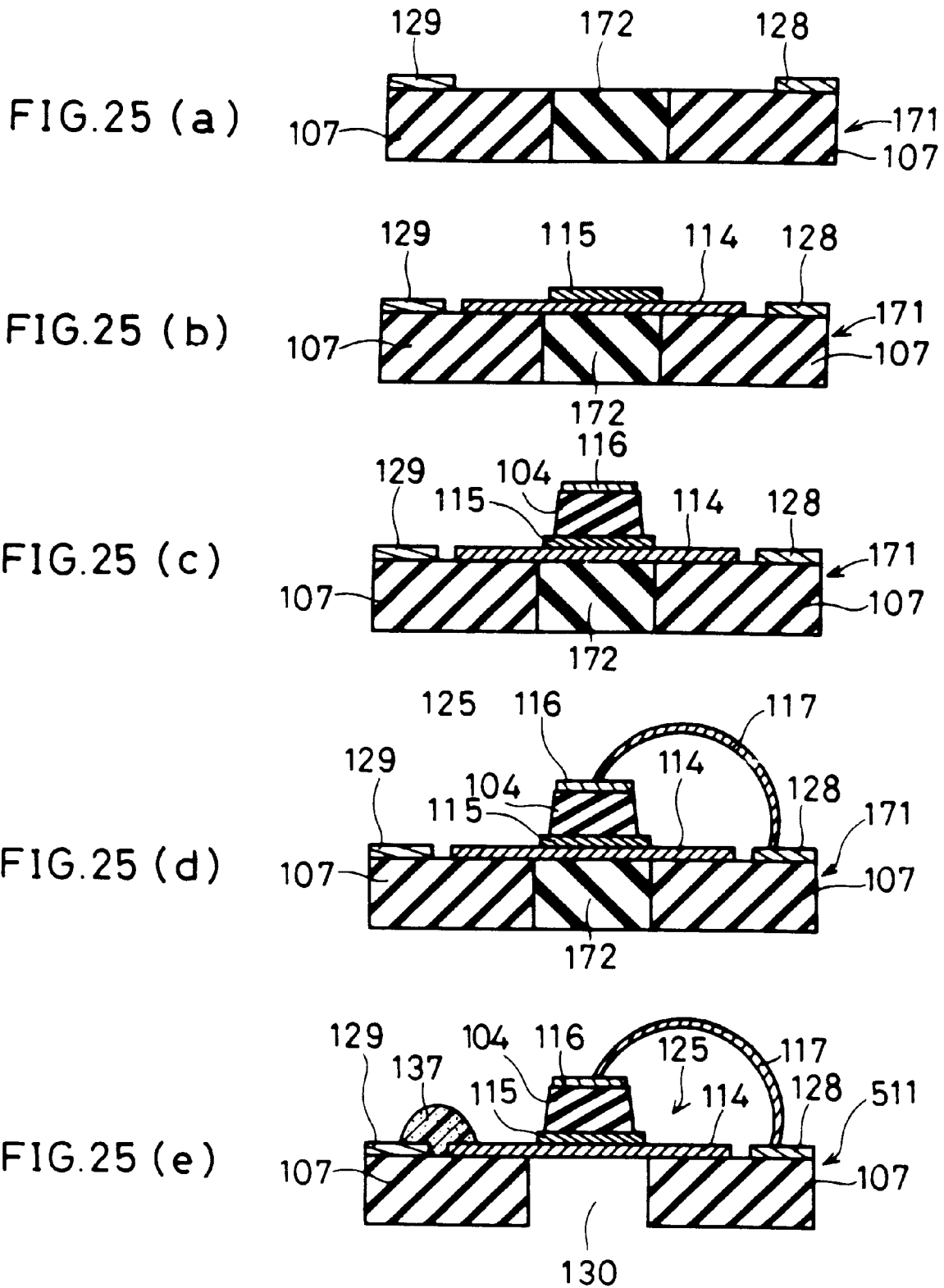
FIG. 25 (a) to (e) are schematic views showing steps of a manufacturing method of a pyroelectric infrared element in a fifth embodiment of this invention.

FIG. 25 (a) to (e) shows a method of manufacturing the pyroelectric infrared sensor element 511 configured above. As in Example 11, the ceramic substrate 107 made of alumina was prepared in advance which had a size of 5 mm×5 mm, a thickness of 1 mm, and the opening part 130 penetrating near the center with a size of 1 mm×1 mm. This substrate was applied in advance with Pd paste at a predetermined surface part and was burned at 1050° C. to form the connection electrodes 128 and 129. After filling KBr powder into the opening part 130 of the ceramic substrate 107 and hardening the powder, KBr was heated at 740° C. under reduced pressure and melted. In this way, the ceramic substrate 171 having a filled opening part is formed (FIG. 25 (a)). Here, a KBr filled part 172 was smoothed by polishing the surface. Next, the metal Ni film 114 was formed on the surface of the substrate 171 having the KBr filled part 172 by a rf sputtering method. Then, a rock-salt crystal structure oxide of the conductive NiO film 115 (Li added) was formed (size 0.6 mm×0.6 mm, thickness 0.4 μm) was formed on the surface of the metal Ni film 114 by a plasma MOCVD method. As in Example 2, the vertical direction of the metal Ni film 114 was crystal-oriented to (100) direction against the surface of the metal Ni film 114 (FIG. 25 (b)). Then, as also mentioned in the manufacturing method of a conventional pyroelectric infrared sensor element, a rf magnetron sputtering method was used to form a PLT film 104 (0.2 μm×0.2 μm) on the surface of the conductive NiO film 115 by an epitaxial growth. The PLT film 104 had a thickness of 3 μm and was crystal-oriented to a c-axis on which a Ni—Cr electrode film 116 was formed by a sputtering method (FIG. 25 (c)). Next, by means of a wire bonding method, the Ni—Cr electrode film 116 was connected to the connection electrode 128 via the Au wire 117 (FIG. 25 (d)). The above-manufactured structure was washed with water, thereby removing the KBr filled part 172, and after being dried, the metal Ni film 114 was connected to the connection electrode 129 by the conductive paste 137. In this way, the pyroelectric infrared sensor element 511 was completed (FIG. 25 (e)).

In the pyroelectric infrared sensor element 511 obtained according to the above-noted method, the PLT film 104 which shows pyroelectric properties is merely supported by the metal Ni film 114 of only 0.8 μm thick. However, when this sensor element was compared with the conventional pyroelectric infrared sensor element in which a PLT film is supported by a polyimide resin film, the metal Ni film 114 was thinner and harder than the polyimide resin film, and also a rate of contraction was approximately the same with PLT film 104. As a result, it was confirmed that the mechanical strength was sufficient, and that electrode discontinuity due to cracks etc. did not occur at all.

Furthermore, as in the fourth embodiment, it was confirmed that pyroelectric infrared sensor elements with the same performance could be manufactured by using a different alkali halide material instead of KBr, such as KCl, KI, CsBr, and CsI.

EXAMPLE 13

By referring to FIGS. 26 and 27 (a) to (e), a sixth embodiment of a pyroelectric infrared sensor element of this invention and of a manufacturing method of this pyroelectric infrared sensor element will be described.

Figure 26:
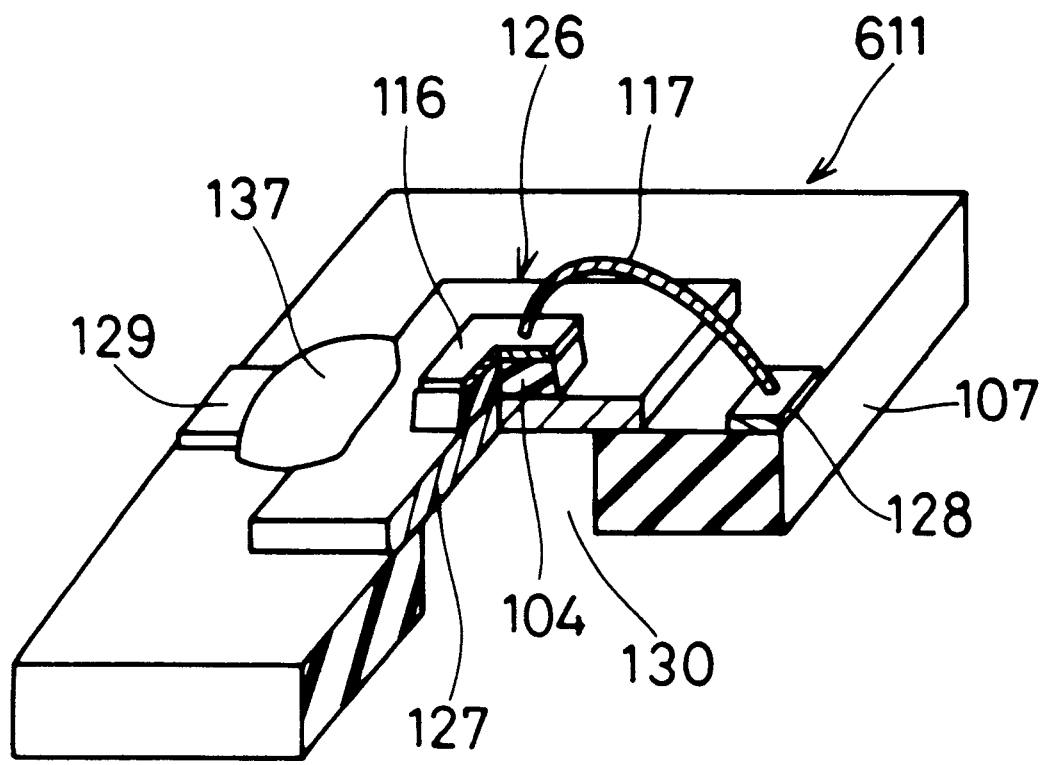
FIG. 26 is a partially cutaway view in perspective showing a sixth embodiment of a pyroelectric infrared element of this invention.

FIG. 26 shows a perspective view of the pyroelectric infrared sensor element in the sixth embodiment. In FIG. 26, members having the same reference numerals as in the above-mentioned embodiments are substantially the same. As shown in FIG. 26, a pyroelectric infrared sensor element 611 in the sixth embodiment is configured such that a multilayer film structure 126 is formed directly on the surface of a ceramic substrate 107, and so that the ceramic substrate 107 has an opening part 130 of a schematic rectangular cross-section near the center. As in the above-mentioned embodiments, it is assumed in this example that the ceramic substrate 107 has a rectangular form of 5 mm×5 mm, a thickness of 1 mm, the opening part 130 of 1 mm×1 mm near the center, and is made of alumina. The multilayer film structure 126 is comprised of a conductive NiO film 127 which also serves as an electrode, a PLT film 104 which is disposed at a predetermined part on top of the metal Ni film 114, a PLT film 104 which is disposed at a predetermined part of the surface of the conductive NiO film 127, and a Ni—Cr electrode film 116 disposed above the PLT film 104. The part of the PLT film 104 is positioned to be on top of the opening part 130. The conductive NiO film 127 has a size of 2 mm×2 mm and a thickness of 2 μm, and the PLT film 104 has a size of 0.2 mm×0.2 mm and a thickness of 3 μm. At a predetermined surface part of the ceramic substrate 107, connection electrodes 128 and 129 are disposed. The connection electrode 129 is connected to the conductive NiO film 127 via a conductive paste 137, and the connection electrode 128 is connected to the Ni—Cr electrode film 116 via an Au wire 117.

Figure 27:
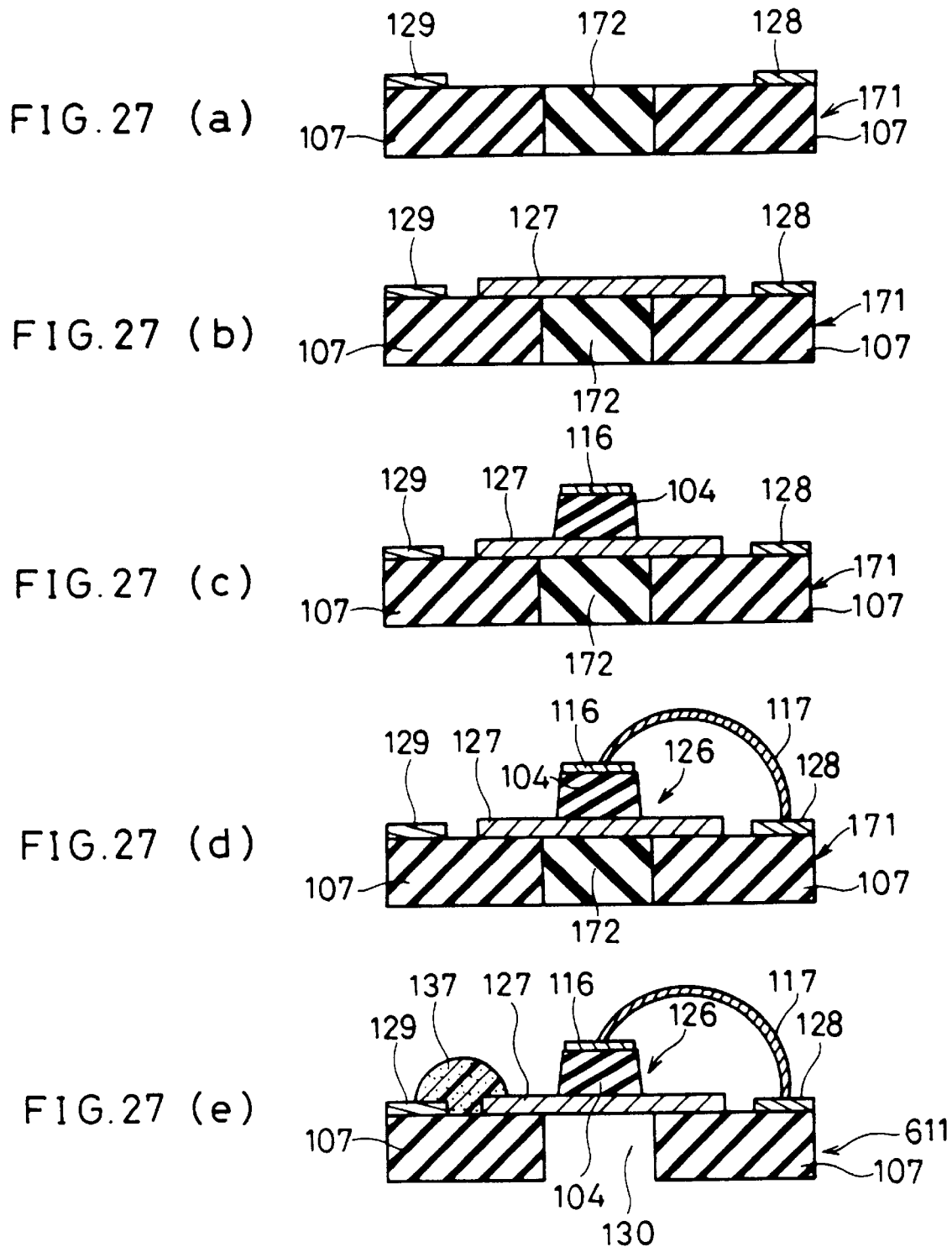
FIG. 27 (a) to (e) are schematic views showing steps of a manufacturing method of a pyroelectric infrared element in a sixth embodiment of this invention.
Figure 28:
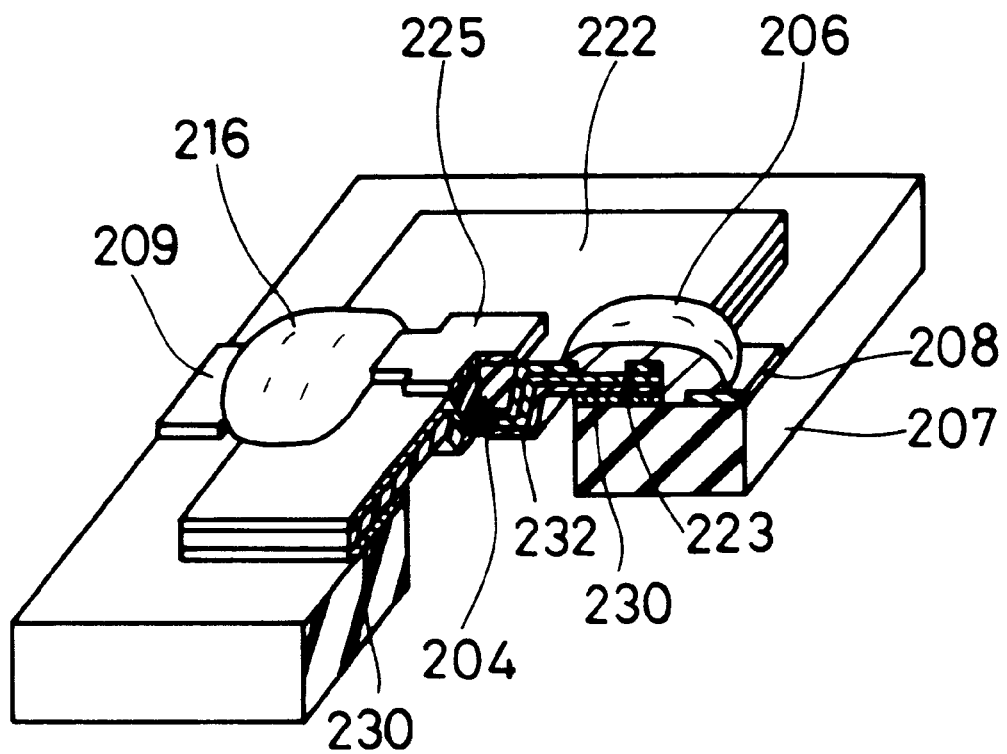
FIG. 28 is a partially cutaway view in perspective showing a conventional pyroelectric infrared element.

FIG. 27 (a) to (e) shows a method of manufacturing the pyroelectric infrared sensor element 611 configured above. As in Example 11, the ceramic substrate 107 made of alumina was prepared in advance which had a size of 5 mm×5 mm, a thickness of 1 mm, and the opening part 130 penetrating near the center with a size of 1 mm×1 mm. This substrate was applied in advance with Pd paste at a predetermined surface part and was burned at 1050° C. to form the connection electrodes 128 and 129. After filling KBr powder into the opening part 130 of the ceramic substrate 107 and hardening the powder, the KBr was heated at 740° C. under reduced pressure and melted.

In this way, the ceramic substrate 171 having a filled opening part is formed (FIG. 27 (a)). Here, a KBr filled part 172 was smoothed by polishing the surface. Next, a rock-salt crystal structure oxide of the conductive NiO film 127 (Li added) was formed (size 2 mm×2 mm, thickness 2 μm) on the surface of the substrate 171 having the KBr filled part 172 by a plasma MOCVD method as in Example 10. The vertical direction of the conductive NiO film 127 was crystal-oriented to (100) direction against the surface of the substrate 171 (FIG. 27 (b)). Then, by using the sputtering method as in Example 8, a PLT film 104 (0.2 μm×0.2 μm) was formed on the surface of the conductive NiO film 127 by an epitaxial growth of the PLT film. The PLT film 104 had a thickness of 3 μm and was crystal-oriented to a c-axis on which a Ni—Cr electrode film 116 was formed (FIG. 27 (c)). Next, by means of a wire bonding method, the Ni—Cr electrode film 116 was connected to the connection electrode 128 via the Au wire 117 (FIG. 27 (d)). The above-manufactured structure was washed with water, thereby removing the KBr filled part 172, and after being dried, the conductive NiO film 127 was connected to the connection electrode 129 by the conductive paste 137. In this way, the pyroelectric infrared sensor element 611 was completed (FIG. 27 (e)).

In the pyroelectric infrared sensor element 611 obtained according to the above-noted method, the PLT film 104 which shows pyroelectric properties is merely supported by the conductive NiO film 127 of only 2 μm thick. However, when this sensor element was compared with the conventional pyroelectric infrared sensor element in which a PLT film is supported by a polyimide resin film, the conductive NiO film 127 of 2 μm thick was thinner and harder than the polyimide resin film, and also the rate of contraction was approximately the same with the PLT film 104. As a result, it was confirmed that the mechanical strength was sufficient, and that electrode discontinuity due to cracks etc. did not occur at all.

Furthermore, as in the fourth embodiment, it was confirmed that pyroelectric infrared sensor elements with the same performance could be manufactured by using a different alkali halide material instead of KBr, such as KCl, KI, CsBr, and CsI.

As mentioned above, the pyroelectric infrared sensor elements which were described in the above-noted embodiments of this invention does not require a conventional polyimide resin film for holding a piezoelectric dielectric oxide film. Instead, an oxide film or a metal film etc. is used which is thinner and harder than the polyimide resin film and hardly differs from the piezoelectric dielectric oxide film with regard to contraction rate. Accordingly, electrode discontinuity or cracks in the holding film tend not to occur. In addition, since it is no longer necessary to use an expensive MgO monocrystal substrate which has a cleavage plane of (100) and must be mirror polished as the substrate, this sensor element costs less. As also mentioned above, the method of manufacturing the pyroelectric infrared sensor element of this invention uses alkali halide which can be removed by washing with water, so that it is no longer necessary to conduct the step of carefully removing a MgO monocrystal substrate by etching. As a result, the pyroelectric infrared sensor element can be manufactured with reduced cost.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A method of manufacturing a thin film sensor element, the thin film sensor element comprising a sensor holding substrate having a part having an opening therein and a multilayer film structure adhered thereon, the multilayer film structure comprising a first electrode film, a second electrode film and a piezoelectric dielectric oxide film present between the first and second electrode films, with said multilayer film structure placed in a predetermined relationship with said opening, said method comprising the steps of:

forming the multilayer film structure by forming the first electrode film having a (100) plane orientation on a surface of an alkali halide substrate, forming the piezoelectric dielectric oxide thereon, and forming the second electrode film on said piezoelectric dielectric oxide;

adhering the multilayer film structure on the surface of the sensor holding substrate in said predetermined relationship with said opening; and dissolving and removing the alkali halide substrate with water.

2. The method of manufacturing a thin film sensor element as in claim 1, wherein said alkali halide material is a rock-salt crystal composed of at least one alkali metal element selected from the group consisting of Na, K, and Cs, and at least one halogen element selected from the group consisting of F, Cl, Br, and I.

3. The method of manufacturing a thin film sensor element as in claim 1, wherein said alkali halide material is at least one salt selected from the group consisting of NaF, NaCl, KCl, KBr, CsBr, KI, and CsI.

4. The method of manufacturing a thin film sensor element as in claim 1, wherein said piezoelectric dielectric oxide film has a thickness of from 100 nm to 20 μm.

5. The method of manufacturing a thin film sensor element as in claim 1, wherein said sensor element is at least one thin film sensor element selected from the group consisting of an acceleration sensor element and a pyroelectric infrared sensor element.

6. The method of manufacturing a thin film sensor element as in claim 1, said multilayer film structure forming step further comprising the steps of:

disposing a rock-salt crystal structure oxide film oriented to the (100) plane orientation on the surface of the alkali halide substrate;

disposing a Pt electrode film having a (100) plane orientation thereon;

disposing the piezoelectric dielectric oxide film thereon; and disposing the second electrode film on top of said piezoelectric dielectric oxide film.

7. The method of manufacturing a thin film sensor element as in claim 1, said multilayer film structure forming step further comprising the steps of:

disposing a metal electrode film on the surface of the alkali halide substrate;

disposing a conductive NiO electrode film having a (100) plane orientation thereon;

disposing the piezoelectric dielectric oxide film thereon; and disposing the second electrode film on top of said piezoelectric dielectric oxide film.

8. The method of manufacturing a thin film sensor element as in claim 1, said multilayer film structue forming step further comprising the steps of:

disposing a conductive NiO electrode film oriented to the (100) plane orientation on the surface of the alkali halide substrate;

disposing the piezoelectric dielectric oxide film thereon; and disposing the second electrode film on said piezoelectric dielectric oxide film.

9. The method of manufacturing a thin film sensor element as in claim 1, said multilayer film structure forming step further comprising the steps of:

filling alkali halide into the opening of said sensor holding substrate and smoothing the surface of the sensor holding substrate;

disposing a rock-salt crystal structure oxide film having the (100) plane orientation on the surface of the sensor holding substrate;

disposing a Pt electrode film having a (100) plane orientation thereon;

disposing the piezoelectric dielectric oxide film thereon; and disposing the second electric film on top of said piezoelectric dielectric oxide film.

10. The method of manufacturing a thin film sensor element as in claim 1, said multilayer film structure forming step further comprising the steps of:

filling alkali halide into the opening of said sensor holding substrate and smoothing the surface of the sensor holding substrate;

disposing a metal electrode film on the surface of the sensor holding substrate;

disposing a conductive NiO film having a (100) plane orientation thereon;

disposing the piezoelectric dielectric oxide film thereon; and disposing the second electrode film on the surface of said piezoelectric dielectric oxide film.

11. The method of manufacturing a thin film sensor element as in claim 1, said multilayer film structure forming step further comprising the steps of:

filling alkali halide into the opening of said sensor holding substrate and smoothing the surface of the sensor holding substrate;

disposing a conductive NiO film on the surface of the sensor holding substrate;

disposing the piezoelectric dielectric oxide film thereon; and disposing the second electrode film on the surface of said piezoelectric dielectric oxide film.

12. The method of manufacturing a thin film sensor element as in claim 1, wherein said piezoelectric dielectric oxide film comprises a titanate lead zirconate film.

13. The method of manufacturing a thin film sensor element as in claim 1, wherein said piezoelectric dielectric oxide film comprises a titanate lead lanthanum film.

14. The method of manufacturing a thin film sensor element as in claim 6, wherein said rock-salt crystal structure oxide film having (100) plane orientation is at least one film selected from the group consisting of MgO, NiO, and CoO.

15. The method of manufacturing a thin film sensor element as in claim 11, wherein the conductive NiO electrode film having (100) plane orientation is a thin film to which lithium is added as a dopant.

16. The method of manufacturing a thin film sensor element as in claim 12, said multilayer film structure forming step further comprising the step of disposing a rock-salt crystal structure oxide film having the (100) plane orientation on the surface of the alkali halide substrate, wherein said rock-salt crystal structure oxide film having the (100) plane orientation is at least one film selected from the group consisting of MgO, NiO and CoO.

17. The method of manufacturing a thin film sensor element as in claim 7, wherein the conductive NiO electrode film having (100) plane orientation is a thin film to which lithium is added as a dopant.

18. The method of manufacturing a thin film sensor element as in claim 8, wherein the conductive NiO electrode film having (100) plane orientation is a thin film to which lithium is added as a dopant.

19. The method of manufacturing a thin film sensor element as in claim 10, wherein the conductive NiO electrode film having (100) plane orientation is a thin film to which lithium is added as a dopant.

20. The method of manufacturing a thin film sensor element as in claim 6, said adhering step further comprising the step of reversing and adhering said multilayer film structure to said sensor holding ceramic substrate.

21. The method of manufacturing a thin film sensor element as in claim 7, said adhering step further comprising the step of reversing and adhering said multilayer film structure to said sensor holding substrate.

22. The method of manufacturing a thin film sensor element as in claim 8, said adhering step further comprising the step of reversing and adhering said multilayer film structure to said sensor holding substrate.

* * * * *